(12) United States Patent
Tamura

(10) Patent No.: US 6,380,573 B1
(45) Date of Patent: Apr. 30, 2002

(54) SEMICONDUCTOR MEMORY DEVICE AND METHOD FOR PRODUCING THE SAME

(75) Inventor: Akiyoshi Tamura, Osaka (JP)

(73) Assignee: Matsushita Electronics Corporation ( * ) Notice: Subject to any disclaimer, the term of this patent is extended or adjusted under 35 U.S.C. 154(b) by 0 days.

(21) Appl. No.: 09/460,062

(22) Filed: Dec. 14, 1999

(30) Foreign Application Priority Data

Dec. 16, 1998 (JP) .............................. 10-357504

(51) Int. Cl.$^7$ .................. H01L 29/76; H01L 29/94; H01L 31/062; H01L 31/113; H01L 31/119
(52) U.S. Cl. .................. 257/295; 257/310; 257/308; 257/309
(58) Field of Search ................. 257/295, 310, 257/296, 308, 309

(56) References Cited

U.S. PATENT DOCUMENTS

| | | | |
|---|---|---|---|
| 4,888,246 A | | 12/1989 | Kuwata et al. .............. 428/432 |
| 5,436,490 A | * | 7/1995 | Nakamura ................... 257/410 |
| 5,442,585 A | * | 8/1995 | Eguchi et al. .............. 365/149 |
| 5,452,178 A | * | 9/1995 | Emesh et al. ................ 361/303 |
| 5,696,394 A | * | 12/1997 | Jones, Jr. et al. ........... 257/295 |

FOREIGN PATENT DOCUMENTS

| | | |
|---|---|---|
| EP | 0 540 993 A1 | 12/1993 |
| JP | 855919 | 2/1996 |
| JP | 8330531 | 12/1996 |

OTHER PUBLICATIONS

European Search Report for Application No. EP 99 12 4901 dated Aug. 11, 2000.
European Search Report Application No. 99124901.2, dated May 23, 2000.
Gouin, X. et al.; "Infrared dielectric response to BaTaO/sub 2/N"; *Solid State Communications*; Mar. 1995, vol. 93, pp. 857–859.

* cited by examiner

Primary Examiner—Jerome Jackson, Jr.
Assistant Examiner—Jesse A. Fenty
(74) Attorney, Agent, or Firm—Renner, Otto, Boisselle & Sklar

(57) ABSTRACT

A semiconductor memory device includes a semiconductor substrate having a channel therein; a gate insulating layer formed of a ferroelectric material provided on the semiconductor substrate; and a gate electrode provided on the gate insulating layer. The ferroelectric material includes a nitrogen (N) and at least one element selected from the group consisting of Mg, Sr, Ba and Ca.

31 Claims, 20 Drawing Sheets

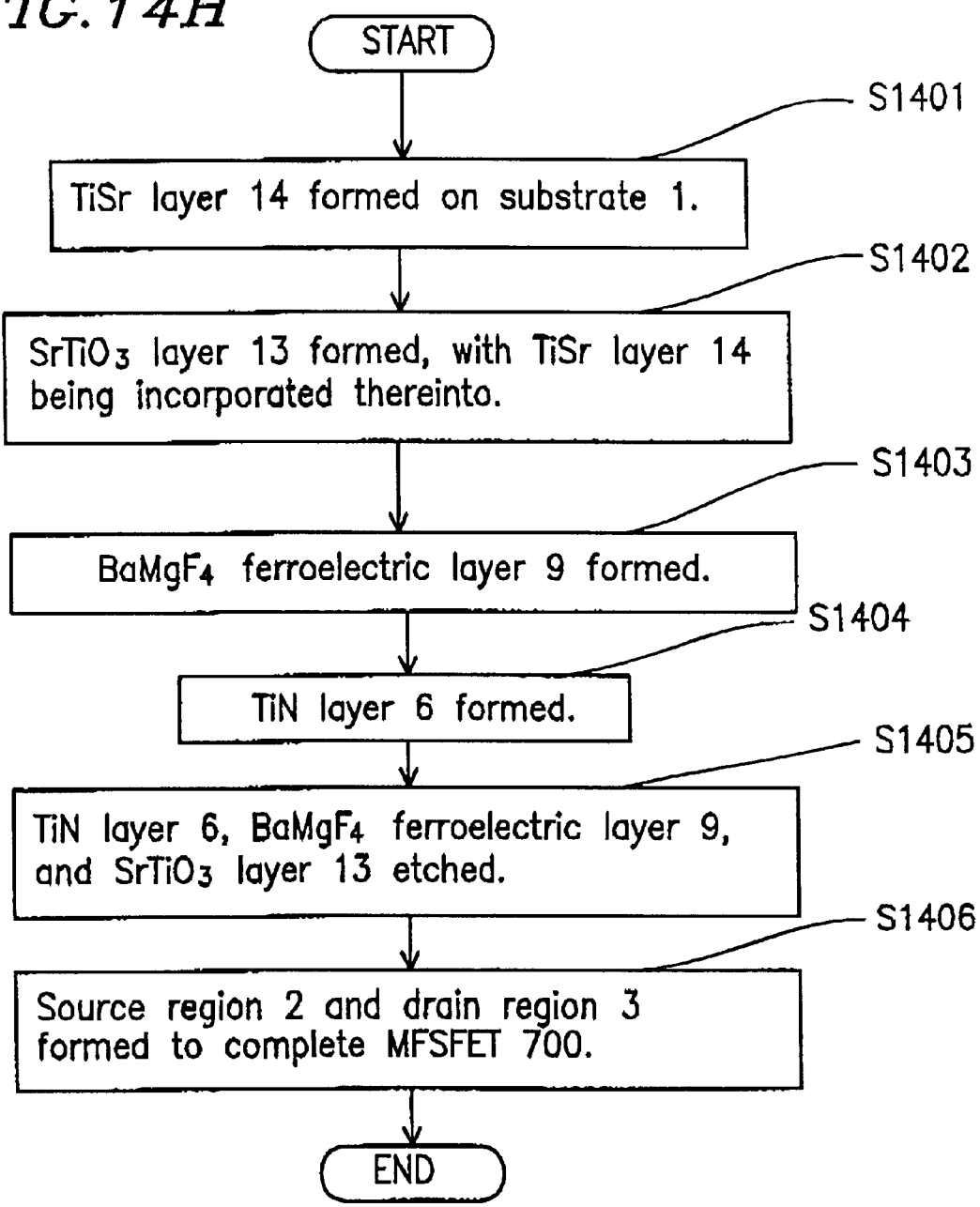

SEMICONDUCTOR MEMORY DEVICE AND METHOD FOR PRODUCING THE SAME

BACKGROUND OF THE INVENTION

1. Field of the Invention

The present invention relates to a semiconductor memory device including a film formed of a ferroelectric material and a method for producing the same, and specifically to a non-volatile memory device including a film formed of a ferroelectric material and a method for producing the same.

2. Description of the Related Art

Non-volatile memory devices including a film formed of a ferroelectric material are roughly classified into two types. One type is referred to as a capacitor type device. and the other is referred to as an MFS (metal-ferroelectric-semiconductor) FBT device.

A capacitor type device has a capacitor structure including a ferroelectric thin film interposed between two electrodes. Information is read or written by detecting whether or not there is an inverted current which flows when the spontaneous polarization of the ferroelectric film is inverted. The capacitor type device mainly has the following two problems (1) since the stored information is destroyed when the information is read, rewrite of the information is required; and (2) each time the information is read, the spontaneous polarization is inverted, which causes fatigue.

The capacitor type device also has an advantage in that the ferroelectric film, which is provided on a Pt electrode or the like, tends to have relatively high quality. Due to this advantage, the capacitor type device has been developed for practical use. In order to secure a sufficient amount of signals required to determine the contents of the memory, oxide ferroelectric materials having a relatively high value of spontaneous polarization are the main targets of study. Such oxide ferroelectric materials are, for example, PZT (lead zirconate titanate) represented by Pb $(Zr^x Ti_{1-x})O_3$ ($0 \leq x \leq 1$), and Bi-based layered oxides including $BrBi_2Ta_2O_9$ and $Bi_4Ti_3O_{12}$.

MFSFET devices allow non-destructive information read. An MFSFET device includes an Si (silicon) substrate having, in a surface area thereof, a source region and a drain region each formed of an impurity diffusive region and a channel region sandwiched between the source region and the drain region; a gate insulating layer formed of a ferroelectric thin film provided on the channel region, and a gate electrode provided on the ferroelectric thin film. The ferroelectric thin film is included in place of a gate oxide film included in a usual MOS (metal-oxide-semiconductor)FET. An MFSFET utilizes the phenomenon, in which charges are exalted on a surface of the semiconductor substrate by spontaneous polarization of the ferroelectric thin film, to control the conductivity in the channel region.

Information is written into the MFSFET device by applying a positive or negative voltage between the gate electrode and the Si substrate to fix the polarization direction of the ferroelectric thin film. Information is read from the MFSFET device in a non-destructive manner by detecting the conductivity state of the channel region. The conductivity state of the channel region changes in accordance with the direction of the polarization direction of the ferroelectric thin film.

The ferroelectric thin film is required to have a polarization charge amount which to only sufficient to change the potential on the surface of the Si substrate Thus, the value of the spontaneous polarization required for the MFSFET device is smaller than that required for the capacitor type device.

As can be appreciated from the above description, the MFSFET device realizes non-destructive information read and accordingly does not require rewrite of the information as is required in the capacitor type device. Thus, the MFSFET device does not have the problem of the fatigue by the polarization which is unavoidable in the case of the capacitor type device. The MFSFET device also needs only a smaller memory cell area than the capacitor type device, and thus is highly suitable for higher integration.

However, the MFSFET device has the following problems in terms of stability.

Formation of a ferroelectric thin film of an oxide ferroelectric material of, for example, PZT, $SrBi_2Ta_2O_9$ or $Bi_4Ti_3O_{12}$ directly on the Si substrate usually includes a process of heat treatment performed at a temperature as high as 500° C. to 800° C. Accordingly, an element of the ferroelectric material, e.g., Pb or Bi, is diffused in the Si substrate to form an interface reaction layer; or an Si oxide film is formed at a surface of the Si substrate by oxygen. This undesirably results in, for example, deterioration in the crystallinity of the ferroelectric thin film or an increase in the interface state density (problem 1). When an Si oxide film or the like having a relatively low specific dielectric constant is formed, the effective voltage applied on the ferroelectric portion of the film is significantly decreased due to the relatively high specific dielectric constant of the oxide ferroelectric material (200 to 1,000). This results in an increase in the operating voltage (problem 2).

The oxide ferroelectric material is easily reduced by hydrogen gas sintering, etching using hydrogen (H), or metal or insulating film formation which are included in a usual Si-MOSFET process. As a result, the ferroelectric material is changed from an insulating material into a conductive material and thus changes the characteristics thereof. As appreciated from this, the oxide ferroelectric material is not properly usable in the usual Si-MOSFET process (problem 3).

It has been proposed to use a fluoride ferroelectric material such as, for example, $BaMgF_4$ having a specific dielectric constant as low as about 10 in place of the oxide ferroelectric material (see, for example, S. Sinharoy et al., J. Vac. Sci. Technol., A9(3), page 409, 1991). It is difficult to form a $BaMgF_4$ layer directly on the Si substrate in consideration of the coefficient of thermal expansion and the lattice constant of Si and $BaMgF_4$. Therefore, it has been proposed to form a buffer layer formed of a fluoride between the Si substrate and the $BaMgF_4$ layer (Japanese Laid-Open Publication No. 8-55919).

Fluorine (F), which is an element of a fluoride, has problems in terms of stability that fluorine is easily diffused in the Si substrate to form an Si—F bond, thus increasing an interface level (problem 4) and that fluorine reacts with water (problem 5).

It has also been proposed to use an $SrTiO_3$ layer having a relatively high specific dielectric constant as the buffer layer. Like in the case of the oxide ferroelectric material, it is difficult to form an $SrTiO_3$ layer directly on the Si substrate without causing any interface reaction (problem 6). In order to avoid this, it is proposed to form an $SrTiO_3/SiO_2$ two-layer buffer layer as disclosed in Japanese Laid-Open Publication No. 8-335580. However, as disclosed in Japanese Laid-Open Publication No. 7-38061, in the case where the $SrTiO_3$ layer is formed by sputtering, the fluorine contained in an $SrTiO_3$ target in a large amount is diffused in the $SiO_2$ layer during the layer formation or heat treatment performed after the layer formation. As a result, the Si—O bond is cut to form an Si—F bond. At this point, the oxygen (O) released from the Si—O bond it diffused in the Si/SiO$_2$ interface to increase the thickness of the SiO$_2$ layer, thus deteriorating the device characteristics (problem 7).

SUMMARY OF THE INVENTION

According to one aspect of the invention, a semiconductor memory device includes a semiconductor substrate having a channel therein; a gate insulating layer formed of a ferroelectric material provided on the semiconductor substrate; and a gate electrode provided on the gate insulating layer. The ferroelectric material includes a nitrogen (N) and at least one element selected from the group consisting of Mg, Sr, Ba and Ca.

In one embodiment of the invention, the ferroelectric material is represented by formula (1):

$$A_2BN_3 \qquad (1)$$

where A is one element selected from the group consisting of Mg, Sr, Ba and Ca, and B is one element selected from the group consisting of V, Nb, Ta and Mn.

In one embodiment of the invention, the ferroelectric material is represented by formula (2)

$$(A_xB_{1-x})_2CN_3 \qquad (2)$$

where x is in the range of $0 \leq x \leq 1$, A and B are each one element selected from the group consisting of Mg, Sr, Ba and Ca. and C is one element selected from the group consisting of V, Nb, Ta and Mn.

In one embodiment of the invention, the ferroelectric material is represented by formula (3):

$$(A_xB_{1-x})_2(C_yD_{1-y})N_3 \qquad (3)$$

where x is in the range of $0 \leq x \leq 1$, y is in the range of $0 \leq y \leq 1$, A and B are each one element selected from the group consisting of Mg. Sr, Ba and Ca, and C and D are each one element selected from the group consisting of V, Nb, Ta and Mn.

In one embodiment of the invention, the ferroelectric material is represented by formula (4):

$$AB_2N_4 \qquad (4)$$

Where A is one element selected from the group consisting of Mg, Sr, Ba and Ca, and B is one element selected from the group consisting of V, Nb, Ta and Mn.

In one embodiment of the invention, the ferroelectric material is represented by formula (5):

$$(A_xB_{1-x})C_2N_4 \qquad (5)$$

where x is in the range of $0 \leq x \leq 1$, A and B are each one element selected from the group consisting of Mg, Sr, Ba and Ca, and C is one element selected from the group consisting of V, Nb, Ta and Mn.

In one embodiment of the invention, the ferroelectric material is represented by formula (6):

$$(A_xB_{1-x})_2(C_yD_{1-y})_2N_4 \qquad (6)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of V, Nb, Ta and Mn.

In one embodiment of the invention, the ferroelectric material is represented by formula (7):

$$A_2BN_2 \qquad (7)$$

where A and B are each one element selected from the group consisting of Mg, Sr, Ba and Ca.

In one embodiment of the invention, the ferroelectric material is represented by formula (8):

$$(A_xB_{1-x})_2(C_yD_{1-y})N_2 \qquad (8)$$

where x is in the range of $0 \leq x \leq 1$, y is in the range of $0 \leq y \leq 1$, A, B, C and D are each one element selected from the group consisting of Mg, Sr, Ba and Ca.

In one embodiment of the invention, the ferroelectric material is represented by formula (9):

$$A_3B_2N_4 \qquad (9)$$

where A is one element selected from the group consisting of Mg, Sr, Ba and Ca, and B is one element selected from the group consisting of Al, Y, La, Sc, Co, Gd, Ce, Nd, Er, V, Ti, Ta, Nb and Mn.

In one embodiment of the invention, the ferroelectric material is represented by formula (10):

$$(A_xB_{1-x})_3C_2N_4 \qquad (10)$$

where x is in the range of $0 \leq x \leq 1$, A and B are each one element selected from the group consisting of Mg, Sr, Ba and Ca, and C is one element selected from the group consisting of Al, Y, La, Sc, Co, Gd, Ce, Nd, Er, V, Ti, Ta, Nb and Mn.

In one embodiment of the invention, the ferroelectric material is represented by formula (11):

$$(A_xB_{1-x})_3(C_2N_4 \qquad (11)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn.

In one embodiment of the invention, the ferroelectric material is represented by formula (12):

$$A_3B_5N_7 \qquad (12)$$

where A is one element selected from the group consisting of Mg, Sr, Ba and Ca, and B is one element selected from the group consisting of Al, Y, La, Sc, Co, Gd, Ce, Nd, Er, V, Ti, Ta, Nb and Mn.

In one embodiment of the invention, the ferroelectric material is represented by formula (13):

$$(A_xB_{1-x})_3C_5N_7 \qquad (13)$$

where x is in the range of $0 \leq x \leq 1$, A and B are each one element selected from the group consisting of Mg, Sr, Ba and Ca, and C is one element selected from the group consisting of Al, Y, La, Sc, Co, Gd, Ce, Nd, Er, V, Ti, Ta, Nb and Mn.

In one embodiment of the invention, the ferroelectric material is represented by formula (14);

$$(A_xB_{1-x})_3(C_yD_{1-y})_5N_7 \qquad (14)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn.

In one embodiment of the invention, the ferroelectric material is represented by formula (15):

$$A_2B_3C_2N_7 \tag{15}$$

where A is one element selected from the group consisting of Mg, Sr, Ba and Ca, B is one element selected from the group consisting of Al, Y, La, Sa, Co, Gd, Ce, Nd, Er, V, Ti, Ta, Nb and Mn, and C is one element selected from the group consisting of Ti, Ta, Mn, Co, Zr, Hf. V and Nb.

In one embodiment of the invention, the ferroelectric material is represented by formula (16).

$$(A_xB_{1-x})_2C_3D_2N_7 \tag{16}$$

where x is in the range of $0 \leq x \leq 1$, A and B are each one element selected from the group consisting of Mg, Sr, Ba and Ca, C is one element selected from the group consisting of Al, Y, La, Sc, Co, Gd, Ce, Nd, Er, V, Ti, Ta, Nb and Mn. and D is one element selected from the group consisting of Ti, Ta, Mn, Co, Zr, Hf. V and Nb.

In one embodiment of the invention, the ferroelectric material is represented by formula (17);

$$(A_xB_{1-x})_2(C_yD_{1-y})_3(E_zF_{1-z})_2N_7 \tag{17}$$

where x is in the range of $0 \leq x \leq 1$, y is in the range of $0 \leq y \leq 1$, z is in the range of $0 \leq x \leq 1$, A and B are each one element selected from the group consisting of Mg, Sr, Ba and Ca, C and D are each one element selected from the group consisting of Al, Y, La, Sc, Co, Gd, Ce, Nd, Er, V, Ti, Ta, Nb and Mn, and E and F are each one element selected from the group consisting of Ti, Ta, Mn, Co, Zr, Hf, V and Nb.

In one embodiment of the invention, the semiconductor memory device further includes a buffer layer between the semiconductor substrate and the gate insulating layer, wherein the buffer layer is formed of one of SiN and $SiO_2$.

According to another aspect of the invention, a method for producing a semiconductor memory device includes the steps of forming a gate insulating layer formed of a ferroelectric material containing nitrogen and at least one element selected from the group consisting of Mg, Sr, Ba and Ca on a semiconductor substrate; and heat-treating the gate insulating layer formed on the semiconductor substrate in one of an ammonia atmosphere and a nitrogen radical ion-containing atmosphere.

In one embodiment of the invention, the ammonia atmosphere is an ammonia plasma atmosphere.

According to still another aspect of the invention, a semiconductor memory device includes a semiconductor substrate having a channel therein; a gate insulating layer provided on the semiconductor substrate; a gate electrode provided on the gate insulating layer; a buffer layer formed of SiN provided between the semiconductor substrate and the gate insulating layer. The gate insulating layer is formed of a fluoride ferroelectric material.

According to still another aspect of the invention, a method for producing a semiconductor memory device includes the steps of forming an $SiO_2$ layer on a semiconductor substrate; nitriding the $SiO_2$ layer in one of an ammonia atmosphere, an $N_2O$ atmosphere, and A nitrogen radical ion-containing atmosphere; forming a gate insulating layer formed of a fluoride ferroelectric material on the nitrided $SiO_2$ layer; and forming a gate electrode on the gate insulating layer.

In one embodiment of the invention, the ammonia atmosphere is an ammonia plasma atmospheres According to still another aspect of the invention, a method for producing a semiconductor memory device includes the steps of forming a gate insulating layer formed of a fluoride ferroelectric material containing fluorine and at least one element selected from the group consisting of Mg, Sr, Ba and Ca on a semiconductor substrate; and nitriding the gate insulating, layer formed on the semiconductor substrate in one of an ammonia atmosphere and a nitrogen radical ion-containing atmosphere.

In one embodiment of the invention, the ammonia atmosphere to an ammonia plasma atmosphere.

In one embodiment of the invention, the fluoride ferroelectric material is one material selected from the group consisting of $BaMgF_4$, $BaCoF_4$, $BaNiF_4$ and $BaZnF_4$.

In one embodiment of the invention, the fluoride ferroelectric material is one material selected from the group consisting of $BaMgF_4$, $BaCoF_4$, $BaNiF_4$ and $BaZnF_4$.

In one embodiment of the invention, the fluoride ferroelectric material is represented by formula (18):

$$ABF_5 \tag{18}$$

where A is one element selected from the group consisting of Mg, Sr, Ba and Ca, and B is one element selected from the group consisting of Al, Y, La, Sc, Co, Gd, Ca, Nd, Er, V, Ti, Ta, Nb and Mn.

In one embodiment of the invention, the fluoride ferroelectric material is represented by formula (18):

$$ABF_5 \tag{18}$$

where A is one element selected from the group consisting of Mg, Sr, Ba and Ca, and B is one element selected from the group consisting of Al, Y, La, Sc, Co, Gd, Ce, Nd, Er, V, Ti, Ta, Nb and Mn.

In one embodiment of the invention, the fluoride ferroelectric material is represented by formula (19)

$$(A_xB_{1-x})(C_yD_{1-y})F_5 \tag{19}$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn.

In one embodiment of the invention, the fluoride ferroelectric material is represented by formula (19)

$$(A_xB_{1-x})(C_yD_{1-y})F_5 \tag{19}$$

where x is in the range of $0 \leq x \leq 1$, y is in the range of $0 \leq y \leq 1$, A and B are each one element selected from the group consisting of Mg, Sr, ga and Ca, and C and D are each one element selected from the group consisting of Al, Y, La, Sc, Co, Gd, Ce, Nd, Er, V, Ti, Ta, Nb and Mn.

In one embodiment of the invention, the fluoride ferroelectric material is represented by formula (20):

$$ABF_6 \tag{20}$$

where A is one element selected from the group consisting of Mg, Sr, Ba and Ca, and B is one element selected from the group consisting of Ti, Ta, Mn, Co, Zr, Ef, V and Nb.

In one embodiment of the invention, the fluoride ferroelectric material is represented by formula (20):

$$ABF_6 \tag{20}$$

where A is one element selected from the group consisting of Mg, Sr, Ba and Ca, and B is one element selected from the group consisting of Ti, Ta, Mn, Co, Zr, Rf, V and Nb.

In one embodiment of the invention, the fluoride ferroelectric material is represented by formula (21)

$$(A_xB_{1-x})(C_yD_{1-y})F_6 \qquad (21)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Ti, Ta, Mn, Co, Zr, Hf, V and Nb.

In one embodiment of the invention, the fluoride ferroelectric material is represented by formula (21):

$$(A_xB_{1-x})(C_yD_{1-y})F_6 \qquad (21)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Ti, Ta, Mn, Co, Zr, HE, V and Nb.

In one embodiment of the invention, the fluoride ferroelectric material is represented by formula (22)

$$A_5B_3F_{19} \qquad (22)$$

where A to one element selected from the group consisting of Mg, Sr, Ba and Ca, and B is one element selected from the group consisting of Al, Y, La, Sc, Co, Gd, Ce, Nd, Er, V, Ti, Ta, Nb and Mu.

In one embodiment of the invention, the fluoride ferroelectric material is represented by formula (22):

$$A_5B_3F_{19} \qquad (22)$$

where A is one element selected from the group consisting of Mg, Sr, Ba and Ca, and B is one element selected from the group consisting of Al, Y, La, Sc, Co, Gd, Ce, Nd, Er, V, Ti, Ta, Nb and Mn.

In one embodiment of the invention, the fluoride ferroelectric material is represented by formula (23):

$$(A_xB_{1-x})_5(C_yD_{1-y})_3F_{19} \qquad (23)$$

where x is in the range of $0 \leq x \leq 1$, y is in the range of $0 \leq y \leq 1$, A and B are each one element selected from the group consisting of Mg, Or, Ba and Ca, and C and D are each one element selected from the group consisting of Al, Y, La, Sc, Co, Gd, Ce, Nd, Er, V, Ti, Ta, Nb and Mn.

In one embodiment of the invention, the fluoride ferroelectric material is represented by formula (23)

$$(A_xB_{1-x})_5(C_yD_{1-y})_3F_{19} \qquad (23)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn.

According to still another aspect of the invention, a semiconductor memory device includes a semiconductor substrate having a channel therein; a buffer layer formed of at least one of $MgSiO_3$, $Mg_2SiO_4$, $SrSiO_3$, $Sr_2SiO_4$, $(Mg_xSr_{1-x})SiO_3$ and $(Mg_xSr_{1-x})_2SiO_4$ (where $0 \leq x \leq 1$) provided on the semiconductor substrate; a gate insulating layer formed of a ferroelectric material provided on the buffer layer: and a gate electrode provided on the gate insulating layer.

In one embodiment of the invention, the ferroelectric material includes at least one element selected from the group consisting of Mg and Sr.

In one embodiment of the invention, the ferroelectric material is formed of at least one material selected from the group consisting of $(Ba_xSr_{1-x})MgF_4$ and $Ba(Mg_xSr_{1-x})F_4$, where $0 \leq x \leq 1$.

According to still another aspect of the invention, a method for producing a semiconductor memory device includes the steps of forming a buffer layer formed of SiN on an Si substrate; forming an $SrTiO_3$ layer on the buffer layer formed of SiN by sputtering; forming a gate insulating layer formed of a ferroelectric material on the $SrTiO_3$ layer, and forming a gate electrode on the gate insulating layer.

In one embodiment of the invention, the buffer layer is formed by directly nitriding the Si substrate.

According to still another aspect of the invention, a method for producing a semiconductor memory device includes the steps of forming a buffer layer formed of $SiO_2$ on an Si substrate; nitriding the buffer layer formed of $SiO_2$ using one of an ammonia atmosphere, an $N_2O$ gas atmosphere, and a nitrogen radical ion-containing atmosphere; forming an $SrTiO_3$ layer on the buffer layer formed of the nitrided $SiO_2$ by sputtering; forming a gate insulating layer formed of a ferroelectric material on the $SrTiO_3$ layer; and forming a gate electrode on the gate insulating layer.

According to still another aspect of the invention, a method for producing a semiconductor memory device includes the steps of forming a thin TiSr layer an Si substrate: forming an $SrTiO_3$ layer on the thin TiSr layer; forming a gate insulating layer formed of ferroelectric material on the $SrTiO_3$ layer; and forming a gate electrode on the gate insulating layer.

In one embodiment of the invention, the $SrTiO_3$ layer is formed by sputtering where the Si substrate has a temperature of about 300° C. or less.

In one embodiment of the invention, the $SrTiO_3$ layer is formed on the thin TiSr layer by sputtering, and the step of forming the $SrTiO_3$ layer includes the steps of using an Ar gas, and using an $Ar/O_2$ gas.

In one embodiment of the invention, the method for producing a semiconductor memory device further includes the step of heat-treating the $SrTiO_3$ layer in one of an oxygen gas atmosphere and an ozone-containing oxygen gas atmosphere at a temperature of about 300° C. or less.

According to the present invention, the ferroelectric layer acting as a gate insulating layer does not include Pb, Bi or other elements which are highly volatile, and includes a nitride excluding oxygen. Since formation of such a ferroelectric layer does not need heat treatment, formation of an interface reaction layer or a silicon oxide layer at an interface between the semiconductor substrate and the ferroelectric layer is suppressed. Therefore, the crystallinity in the ferroelectric layer is not deteriorated or the interface state density is not increased. Thus, satisfactory interface characteristics are obtained. The above-mentioned problem 1 to solved.

The ferroelectric layer according to the present invention has a low specific dielectric constant. Therefore, the effective voltage applied on the ferroelectric portion of the film is not decreased. Accordingly, the operating voltage is not increased. The above-mentioned problem 2 is solved.

Unlike the oxide ferroelectric layer, the nitride ferroelectric layer according to the present invention is not likely to be reduced by hydrogen gas sintering, etching using hydrogen, or metal or insulating film formation which are included in a usual Si-MOSFET process. Thus, the device characteristics are maintained stable. The above-mentioned problem 3 is solved.

In the embodiment where the buffer layer between the semiconductor substrate and the fluoride ferroelectric layer is formed of SiN, or $SiO_2$ having a nitrided surface, the buffer layer acts an a barrier against the diffusion of fluorine which is contained in the fluoride ferroelectric layer in a large amount during heat treatment processes of, for example, formation of the ferroelectric layer, and ion implantation and annealing for activation of the semiconductor substrates As a result, an increase in the interface level caused by the diffusion of fluorine is prevented. An increase in the thickness of the $SiO_2$ layer caused by the diffusion of oxygen released from the Si—O bond is also prevented. Thus, the reliability of the MFSFET device is improved, solving the above-mentioned problem 4.

In the embodiment where the fluoride ferroelectric layer is partially replaced with nitrogen by nitriding in an ammonia atmosphere or a nitrogen radical ion-containing atmosphere, the chemical reactivity of water and other substances is suppressed, thus improving the stability of the MFSFET device. The above-mentioned problem 5 is solved.

In the embodiment where the ferroelectric layer is formed of at least one of Mg and Sr and the buffer layer provided between the semiconductor substrate and the ferroelectric layer is formed of at least one of $MgSiO_3$, $Mg_2SiO_4$, $SrSiO_3$, $Sr_2SiO_4$, $(MgSr_{1-x})SiO_3$ and $(Mg_xSr_{1-x})_2SiO_4$ (where $0 \leq x \leq 1$), the buffer layer has a relatively high dielectric constant. The crystallinity of the ferroelectric layer is improved and a satisfactory interface between the semiconductor substrate and the ferroelectric layer is realized. Thus, problem 6 is solved. The $MgSiO_3$, $Mg_2SiO_4$, $SrSiO_3$, $Sr_2SiO_4$, $(Mg_xSr_{1-x})SiO_3$ and $(Mg_xSr_{1-x})_2SiO_4$ include both (i) Mg or Sr included in the ferroelectric layer and (ii) $SiO_2$, realizing a satisfactory interface characteristic with silicon.

In the embodiment where the $SrTiO_3$ layer is formed by sputtering after the buffer layer formed of SiN, or $SiO_2$ having a nitrided surface obtained by an ammonia gas, an $N_2O$ gas or a nitrogen radical ion-containing gas is formed, the diffusion of fluorine contained in the $SrTiO_3$ layer in a large amount is suppressed. An increase in the interface level caused by the diffusion of fluorine and an increase in the thickness of the $SiO_2$ layer are prevented, The ferroelectric layer maintains a satisfactory interface characteristic with the semiconductor substrate, thus improving the device characteristics. Thus, problem 7 is solved.

In the embodiment where the thin film of TiSr is formed and then the $SrTiO_3$ layer is formed by sputtering in a two-step manner (step 1: using Ar gas; and step 2: using $Ar/O_2$ gas) at a relatively low temperature, the TiSr layer is substantially incorporated into the $SrTiO_3$ layer. Thus, the ferroelectric layer does not have reactivity with the semiconductor substrate.

Thus, the invention described herein makes possible the advantages of providing a stable and reliable semiconductor memory device which has satisfactory characteristics at the interface between the semiconductor substrate and the gate insulating layer formed of a nitride or fluoride ferroelectric material and can be produced using a general Si-MOSFET process; and a method for producing the These and other advantages of the present invention will become apparent to those skilled in the art upon reading and understanding the following detailed description with reference to the accompanying figures.

BRIEF DESCRIPTION OF THE DRAWINGS

FIG. 14H is a flowchart illustrating the exemplary method shown in FIGS. 14A through 14G.

DESCRIPTION OF THE PREFERRED EMBODIMENTS

Hereinafter, the present invention will be described by way of illustrative examples with reference to the accompanying drawings. Herein, "compounds" have compositions which deviate slightly from an exactly stoichiometric ratio. For example, compounds represented by, $H_2O$ include a compound in which the H:O composition ratio is accurately 2:1 as well as a compound in which the H:O composition ratio is slightly different from 2:1.

EXAMPLE 1

Figure 1:
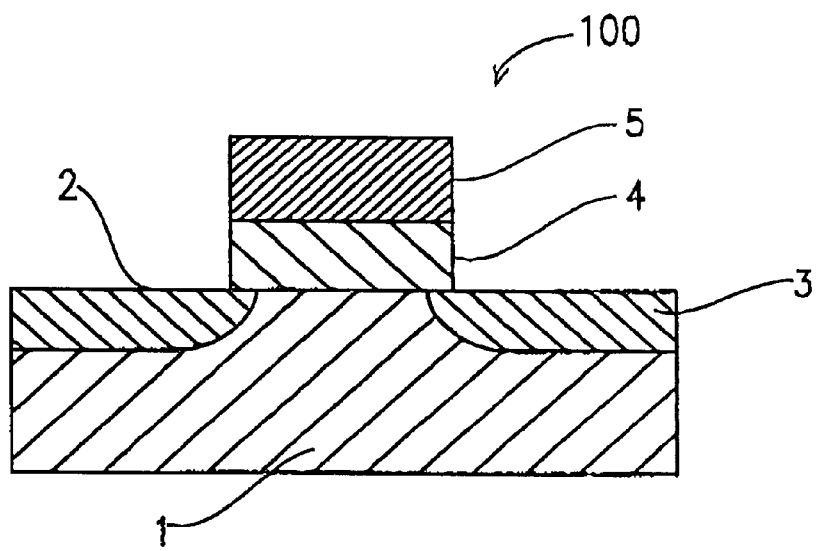
FIG. 1 is a cross-sectional view of a semiconductor memory device in a first example according to the present invention.

FIG. 1 is a cross-sectional view of a semiconductor memory device (also referred to as an "MFSFET device") 100 in a first example according to the present invention.

The MFSFET device 100 includes a p-type Si substrate 1 having a source region 2 and a drain region 3 both of which are n⁺-type impurity regions and are at prescribed locations of a surface area of the p-type Si substrate 1, a nitride ferroelectric layer 4 formed of $Sr_2NbN_3$ provided on a prescribed area of the Si substrate 1 between the source region 2 and the drain region 3, and a gate electrode 5 provided on the nitride ferroelectric layer 4.

Figure 2A:
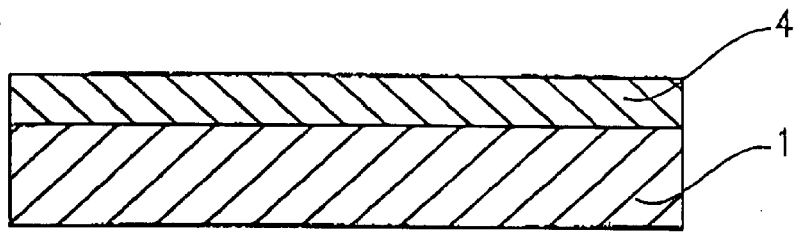
FIGS. 2A through 2D are cross-sectional views illustrating an exemplary method for. producing the Semiconductor memory device shown in FIG. 1.

An exemplary method for producing the MFSFET device 100 will be described. FIGS. 2A through 2D are cross-sectional views illustrating the exemplary method for producing the MFSFET device 100, and FIG. 2E is a flowchart illustrating the exemplary method.

The p-type Si substrate 1 is first treated with a BHF (buffered fluoric acid) solution to remove a natural oxide layer (not shown) on a surface of the p-type Si substrate 1. As shown in FIG. 2A, the resultant p-type Si substrate 1 is, promptly introduced into a solution vaporization type plasma MOCVD (metal-organic chemical vapor deposition) apparatus 150 (FIG. 3) to form the nitride ferroelectric layer 4 formed of $Sr_2NbN_3$ on the p-type Si substrate 1 to a thickness oft for example, about 200 nm (step S201 of FIG. 2E).

Figure 3:
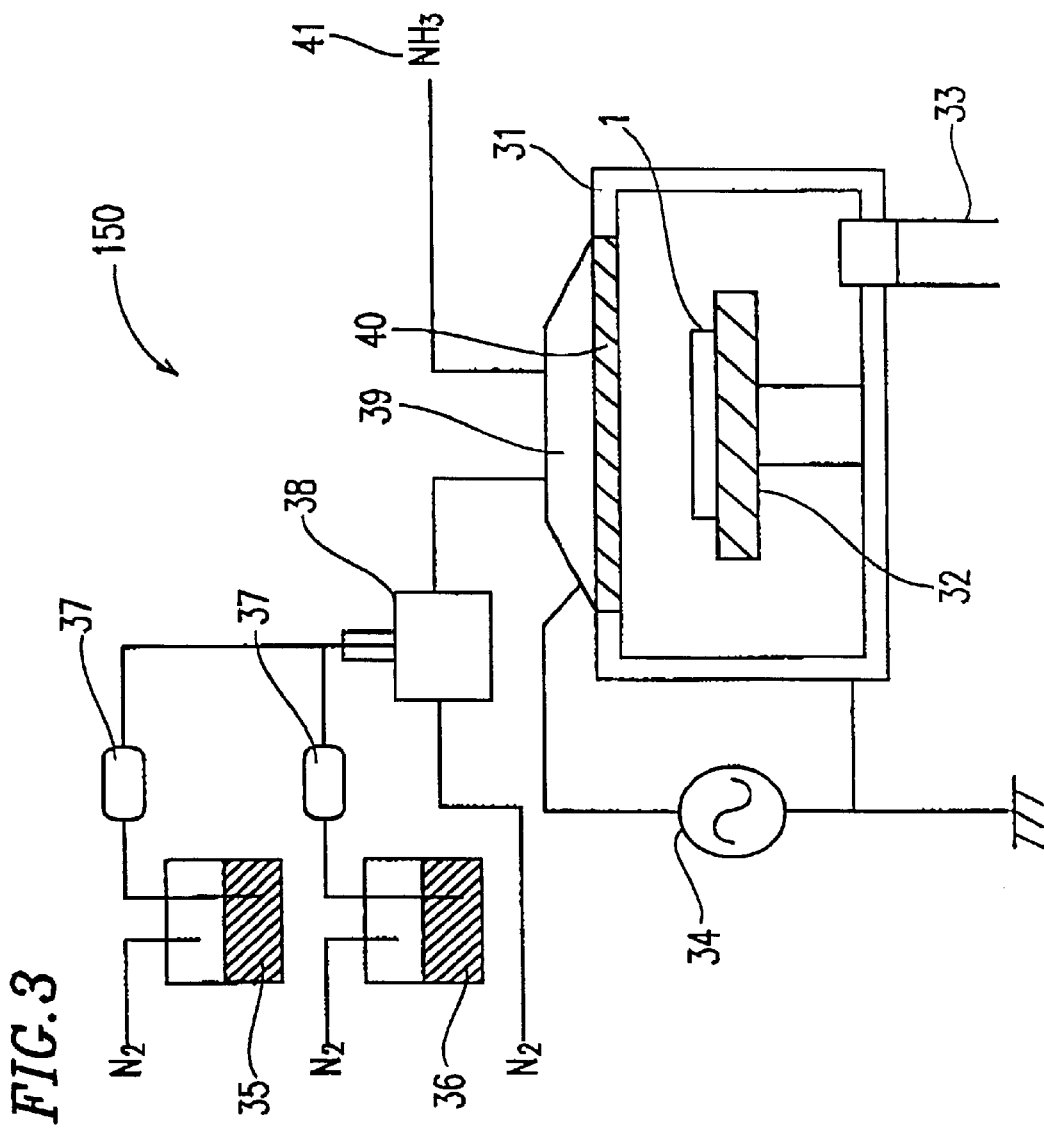
FIG. 3 is a schematic view of a solution vaporization type plasma MOCVD apparatus used for forming a nitride ferroelectric layer included in the semiconductor memory device shown in FIG. 1.

With reference to FIG. 3, a method for forming the nitride ferroelectric layer 4 of $Sr_2NbN_3$ will be described in detail.

FIG. 3 is a schematic view of the solution vaporization type plasma MOCVD apparatus 150. The solution vaporization type plasma MOCVD apparatus 150 includes a vacuum chamber 31, which accommodates a heater 32. As shown in FIG. 3, the p-type Si substrate 1 is placed on the heater 32. The chamber 31 has an outlet 33 communicated with a pump (not shown) for vacuum-exhausting an internal gas. Reference numeral 34 represents a 13.56 MHz RF power supply for generating plasma.

A liquid material 35 can be obtained by dissolving a solid material of $Sr(thd)_2$ in a THF (tetrahydrofuran) solvent $(thd=((CH_3)_3CCO)_2CH^-)$. A liquid material 36 can be obtained by dissolving a solid material of $Nb(O-iC_3H_7)_4$ (thd) in a THF (tetrahydrofuran) solvent. The liquid materials 35 and 36 are quantified by a liquid mass-flow controller 37 so that the molar ratio of Sr:Nb is 2:1, and transported to a vaporizer 38. The liquid materials 35 and 36 are vaporized by the vaporizer 38 into a gas state and then introduced into a mixer 39 together with an $N_2$ gas acting as a carrier gas. The mixer 39 is located on the chamber 31. The mixer 39 contains an $NH_3$ (ammonia) gas 41 introduced thereinto separately. The mixed gas of the gas-state materials 35 and 36, the $N_2$ gas and the $NH_3$ gas 41 is directed to the p-type Si substrate 1 through a shower head 40 to generate plasma. The Sr and Nb are nitrided by ammonia plasma, and thus $Sr_2NbN_3$ is formed on the p-type Si substrate 1. The $Sr_2NbN_3$ layer is formed under the conditions that the temperature of the p-type Si substrate 1 is about 550° C. to about 650° C., the pressure is about 5 mm Torr to about 10 mm Torr and the RF power is about 100 W to about 150 W.

Since an oxygen gas is not used for forming the $Sr_2NbN_3$ layer, the surface of the p-type Si substrate 1 is not oxidized, thus preventing formation of an $SiO_2$ film having a low dielectric constant at an interface between the p-type Si substrate 1 and the $Sr_2NbN_3$ layer. Since $Sr_2NbN_3$ does not include an element which is highly volatile and likely to react with Si, such as Pb or Bi, formation of an interface layer by diffusion of the elements of $Sr_2NbN_3$ in the p-type Si substrate 1 is prevented.

After the $Sr_2NbN_3$ layer is formed, the $Sr_2NbN_3$ layer is heat-treated in an electric oven at about 450° C. for about 30 minutes in an ammonia gas atmosphere to improve the characteristics thereof (step S202 of FIG. 2E). The heat treatment can be performed using ammonia plasma or NR gas plasma, resulting in similar effects. The heat treatment process is performed in order to perfectly nitride the layer to improve the quality of the layer, but the advantages of the present invention are obtained even when the heat treatment is omitted.

Figure 2B:
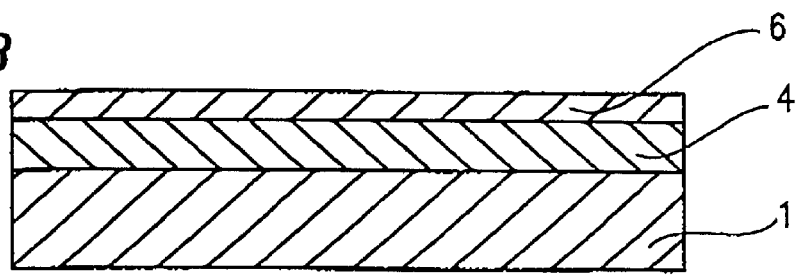

Next, as shown in FIG. 2B, a TiN film 6 to be formed into the gate electrode 5 is formed by reactive sputtering using an $Ar/N_2$ mixed gas (stop S203 of FIG. 2B).

Figure 2C:
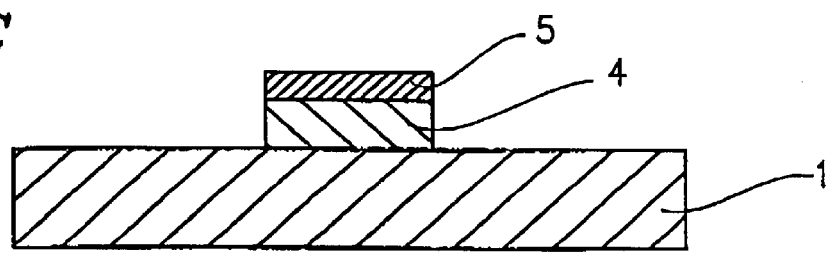
Figure 2D:
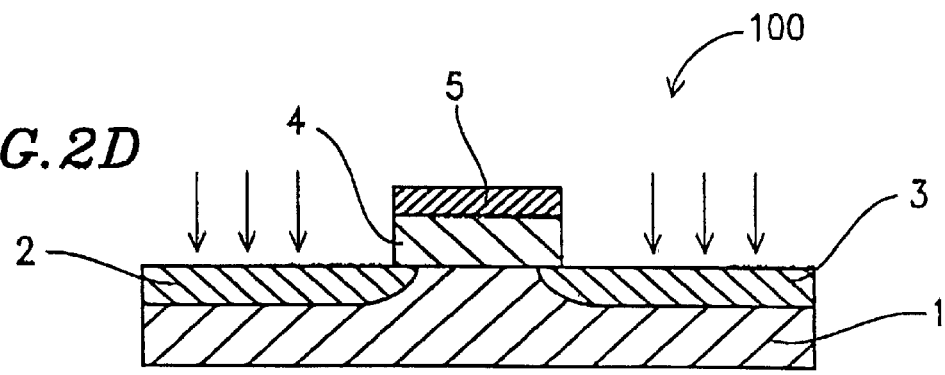
Figure 2E:
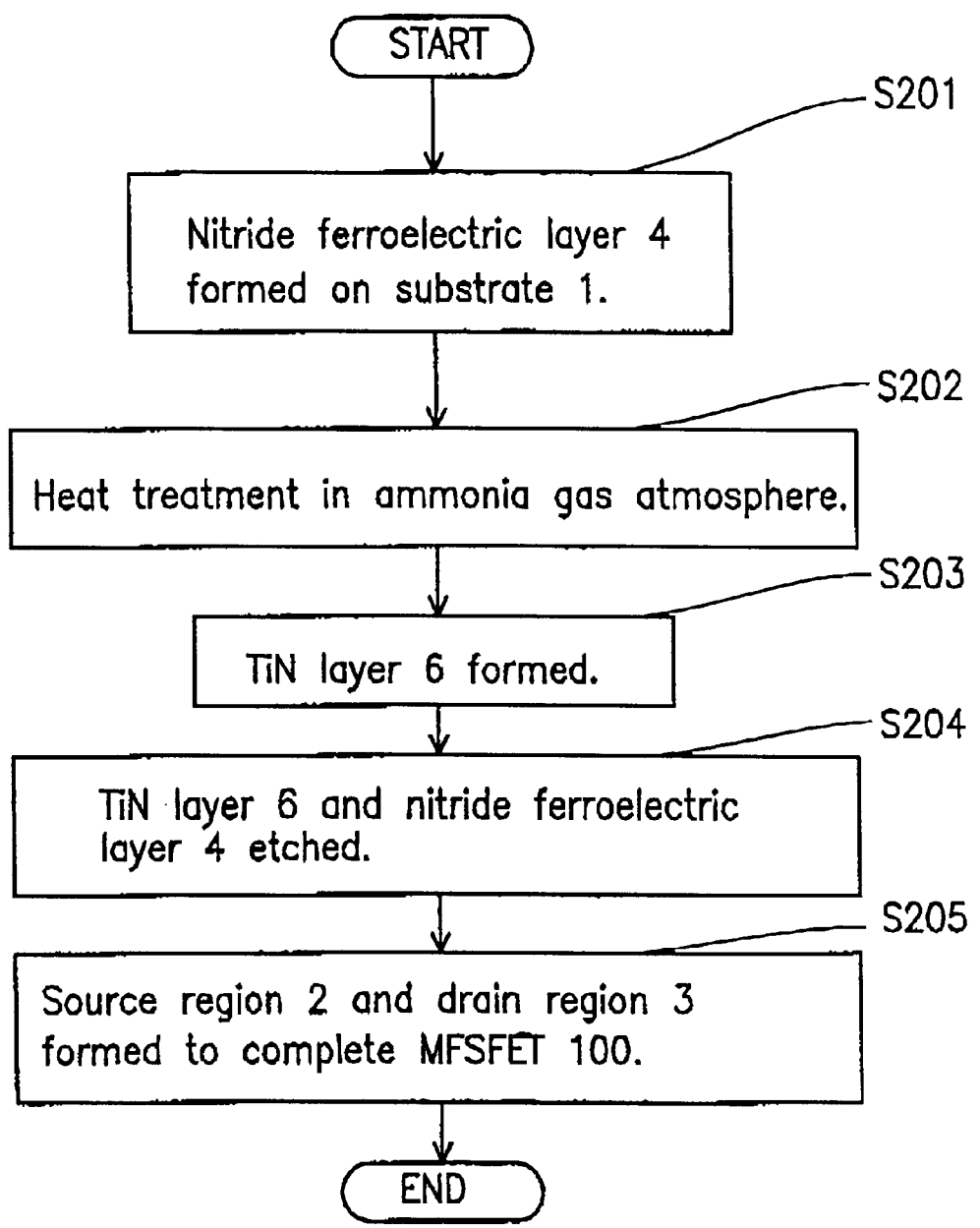
FIG. 2E is a flowchart illustrating the exemplary method shown in FIGS. 2A through 2D.

As shown in FIG. 2C, the TiN film 6 and the nitride ferroelectric layer 4 formed of $Sr_2NbN_3$ are treated by etching to remove prescribed areas thereof, using a resist layer (step S204 of FIG. 2E). The etching is performed with, for example, an $Ar/Cl_2$ mixed gas.

As shown in FIG. 2D, As (arsenic) as an n-type impurity is implanted, and then the resultant body is annealed. As a result, the source region 2 and the drain region 3 are formed. Thus, the MFSFET device 100 is completed (step S205 of FIG. 2E), The nitride ferroelectric layer 4 formed of $Sr_2NbN_3$ has a specific dielectric constant of about 13 and a spontaneous polarization value of as small as 1.0 $\mu C/cm^2$, but the MFSFET device 100 is sufficiently operable at such a small residual polarization value.

The operating characteristics of the MFSFET device 100 produced above will be described.

Figure 4:
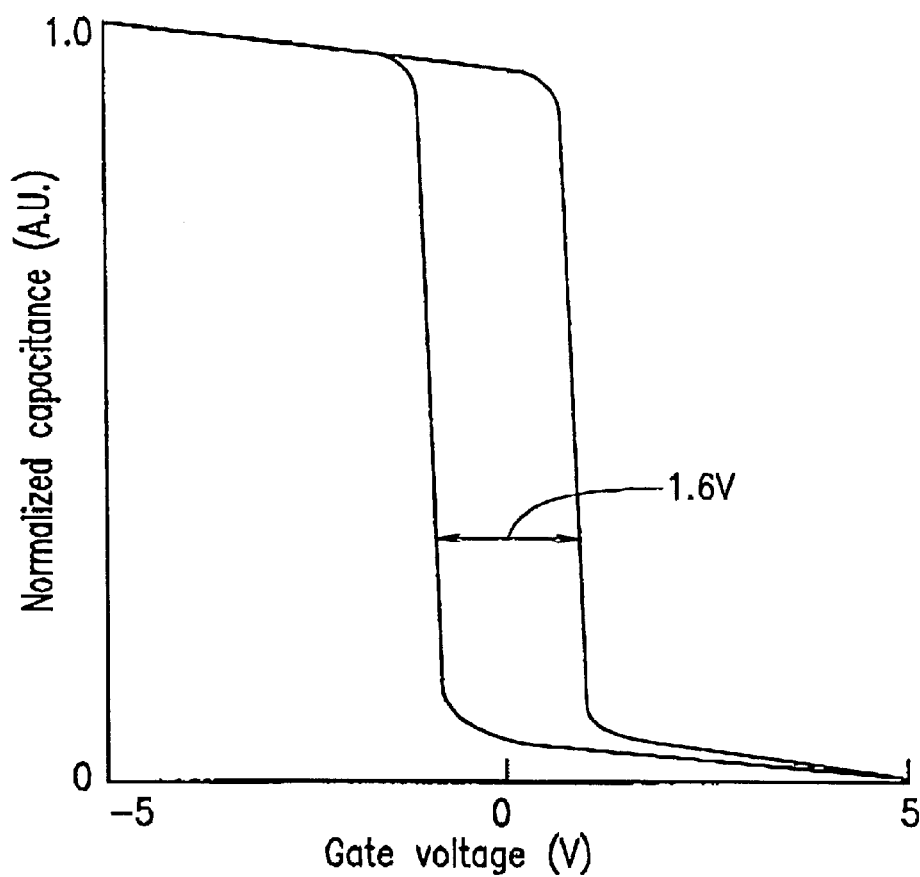
FIG. 4 is a graph illustrating a C-V characteristic of the semiconductor memory device shown in FIG. 1.

FIG. 4 to a graph illustrating a C-V characteristic of the MFSFET device 100. The C-V characteristic is measured under the conditions of ±5.0 V, 1 MHz and the gate area of 100 $\mu m^2$. As shown in FIG. 4, a memory window of about 1.6 V is obtained. The characteristic does not change even after the MFSFET device 100 is heat-treated with a hydrogen gas at about 450° C. for about 30 minutes. This indicates that the MFSFET device 100 is stable against hydrogen gas sintering, etching using hydrogen, or metal or insulating film formation which are included in a usual Si-MOSFET process.

In the above-described example, the MFSFET device 100 includes the nitride ferroelectric layer 4 formed of $Sr_2NbN_3$. Alternatively, the MFSFET device according to the present invention can include a nitride ferroelectric layer formed of a material represented by formula $(A_xB_{1-x})_2(C_yD_{1-y})N_3$ (where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of V, Nb, Ta and Mn). Examples of such a material include $Ba_2TaN_3$, $Ba_2TiN_3$, and $Sr_2TaN_3$. Such a material is obtained by using $Ba(thd)_2$, $Mg(thd)_2$, $Ca(thd)_2$ or the like as the solid material in the liquid material 35 in place of $Sr(thd)_2$, and using $Ta(O-iC_3H_7)_4(thd)$, $Mn(O-iC_3H_7)_4(thd)$ or the like as the solid material in the liquid material 36 in place of $Nb(O-iC_3H_7)_4(thd)$. The resultant nitride ferroelectric layers have similar effects.

Figure 5:
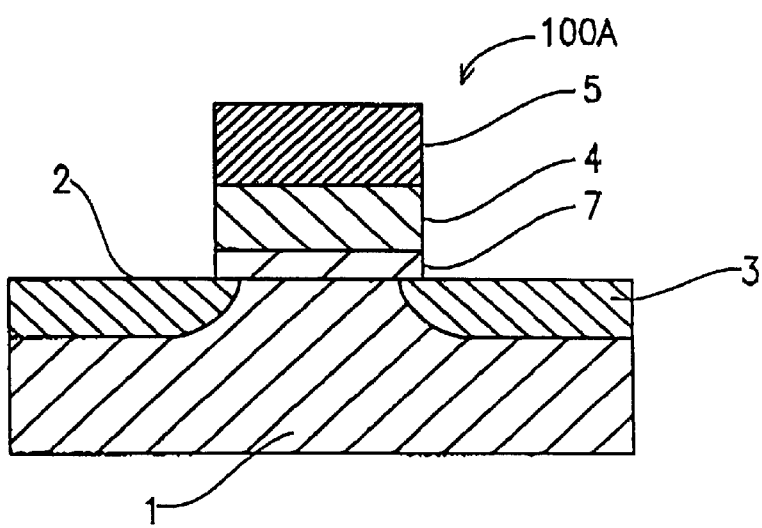
FIG. 5 is a cross-sectional view of a semiconductor memory device in a modification of the first example according to the present invention.

FIG. 5 is a cross-sectional view of an MFSFET device 100A in a modification of the first example according to the present invention. The MFSFET device 100A includes a buffer layer 7 formed of a super-thin SiN film or $SiO_2$ film in addition to the structure shown in FIG. 1 between the p-type Si substrate 1 and the nitride ferroelectric layer 4 formed of $Sr_2NbN_3$, for stabilizing the surface of the p-type Si substrate 1. The buffer layer 7 can be formed by, for example, thermal oxidation or CVD. Since the nitride ferroelectric layer 4 formed of $Sr_2NbN_3$ has a relatively low specific dielectric constant (about 13), an increase in the operating voltage is still suppressed even when the buffer layer 7 having a low specific dielectric constant (SiN: about 7; $SiO_2$: about 4) is provided. Thus, the MFSFET device 100A has improved stability.

In the above-described examples the molar ratio of Sr:Nb is set to 2:1 in the solution vaporization type plasma MOCVD apparatus 150 shown in FIG. 3 When the molar ratio of Sr:Nb is set to 1:2, an $SrNb_2N_4$ layer is obtained. The $SrNb_2N_4$ layer has similar characteristics to those of the $Sr_2NbN_3$ layer, but has a slightly lower specific dielectric constant (i.e., about 12) and a smaller spontaneous polarization value (i.e., 0.8 $\mu C/cm^2$). An MFSFET device including the $SrNb_2N_4$ layer obtains a memory window of about 1.4 V under the same conditions as those for the measurement shown in FIG. 4.

The MFSFET device according to the present invention can include a nitride ferroelectric layer formed of a material represented by formula $(A_xB_{1-x})(C_yD_{1-y})_2N_4$ (where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of V, Nb, Ta and Mn). Examples of such a material include $BaTa_2N_4$, $SrTa_2N_4$, and $BaNb_2N_4$. Such materials are obtained by using different solid materials. The resultant nitride ferroelectric layers have similar effects.

By using different types of solid materials and different number of types of solid materials, the nitride ferroelectric film can be formed of the following exemplary materials, and the resultant ferroelectric layers have similar effects:

Materials represented by formula $(A_xB_{1-x})_3(C_yD_{1-y})_2N_4$ such as, for example, $Ba_3Ti_2N_4$, $Sr_3Ta_2N_4$, and $Mg_3Gd_2N_4$ (where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn);

Materials represented by formula $(A_xB_{1-x})_3(C_yD_{1-y})_5N_7$ such as, for example, $Sr_3Nb_5N_7$, $Ba_3Ti_5N_7$, and $Mg_3La_5N_7$ (where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, ga, Co, Gd, Ce, Nd, Er, V, Ti, Ta, Nb and Mi);

Materials represented by formula $(A_xB_{1-x})_2(C_yD_{1-y})_3(E_zF_{1-z})_2N_7$ such as, for example, $Sr_2Nb_3Ta_2N_7$, $Ba_2Gd_3Ti_2N_7$, and $Mg_2La_3Mn_2$ (where x is in the range of $0 \leq x \leq 1$, y is in the range of $0 \leq y \leq 1$, z is in the range of $0 \leq z \leq 1$, A and B are each one element selected from the group consisting of Mg, Sr, Ba and Ca, C and D are each one element selected from the group consisting of Al, Y, La, Sc, Co, Gd, Ce, Nd, Er, V, Ti, Ta, Nb and Mn, and E and F are each one element selected from the group consisting of Ti, Ta, Mn, Co, Zr, Hf, V and Nb); and Materials represented by formula $(A_xB_{1-x})_2(C_yD_{1-y})N_2$ such as, for example, $Ba_2MgN_2$, $Sr_2BaN_2$ and $Sr_2MgN_2$ (where x is in the range of $0 \leq x \leq 1$, y is in the range of $0 \leq y \leq 1$, and A, B, C and D are each one element selected from the group consisting of Mg, Sr, Ba and Ca).

In the above-described example, the nitride ferroelectric layer 4 is formed by solution vaporization type plasma MOCVD. The nitride ferroelectric layer 4 can be formed by, for example, vacuum vapor deposition. MBE (molecular beam epitaxy), laser ablation, or reactive sputtering.

In the above-described example, the MFSFET device is described. The present invention is also applicable to an MFMIS (metal-ferroelectric-metal-insulator-semiconductor) FET devices including a floating gate electrode and an insulating layer below the ferroelectric layer.

EXAMPLE 2

Figure 6:
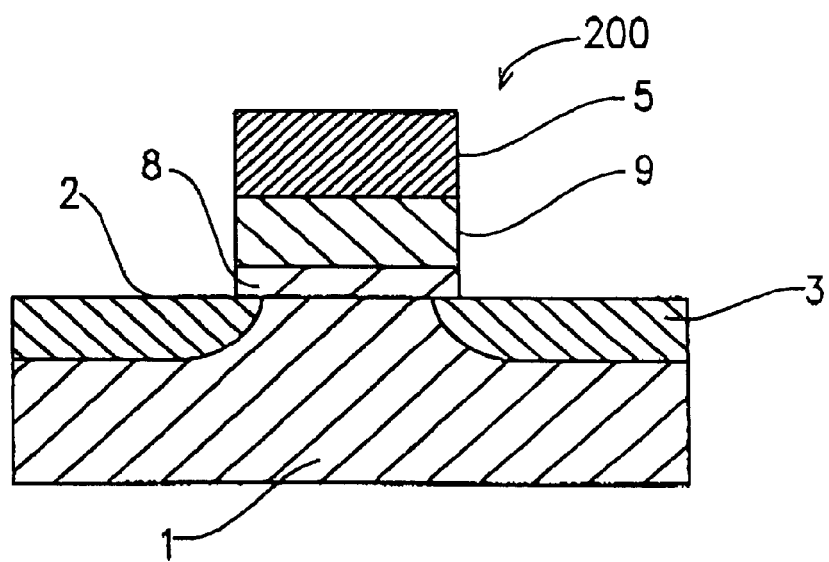
FIG. 6 is a cross-sectional view of a semiconductor memory device in a second example according to the present invention.

FIG. 6 is a cross-sectional view of an MFSFBT device 200 in a second example according to the present invention. Identical elements as those described with reference to FIG. 1 bear identical reference numerals and will not described in detail.

The MFSFET device 200 includes a p-type Si substrate 1 having a source region 2 and a drain region 3 both of which are $n^+$-type impurity regions and are at prescribed locations of a surface area of the p-type Si substrate 1, a buffer layer 8 formed of a super-thin SiN film provided on a prescribed area of the Si substrate 1 between the source region 2 and the drain region 3, a fluoride ferroelectric layer 9 formed of $BaMgF_4$ provided on the buffer layer 8, and a gate electrode 5 provided on the fluoride ferroelectric layer 9.

An exemplary method for producing the MFSFET device 200 will be described. FIGS. 7A through 7E are cross-sectional views illustrating the exemplary method for producing the MFSFET device 200, and FIG. 7F is a flowchart illustrating the exemplary method.

Figure 7A:
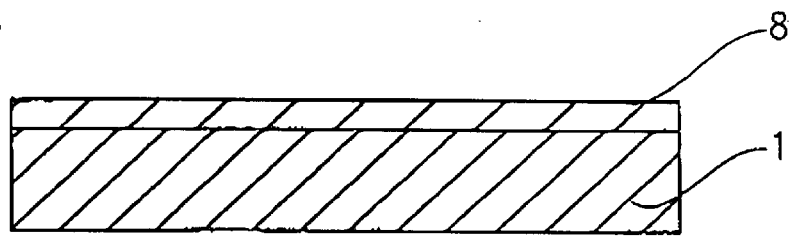
FIGS. 7A through 7E are cross-sectional views illustrating an exemplary method for producing the semiconductor memory device shown in FIG. 6.

The p-type Si substrate 1 is treated with a BHF solution to remove a natural oxide layer (not shown) on a surface of the p-type Si substrate 1. As shown in FIG. 7A, the resultant p-type Si substrate 1 is introduced into an RTA (rapid thermal anneal) apparatus (not shown) to perform direct nitriding (RTN: rapid thermal nitridation) of the p-type Si substrate 1 using an ammonia gas. Thus, the buffer layer 8 formed of an SiN film having a thickness of, for example, about 10 nm is formed (step S701 of FIG. 7F). Alternatively, the nitride layer (i.e., the buffer layer 8) can be formed by CVD. The thickness of the buffer layer 8 is preferably between about 5 nm to about 15 nm in consideration of the trade-off of the increase in the operating voltage of the MFSFET device 200 and the withstand voltage of the buffer layer 8.

Figure 7B:
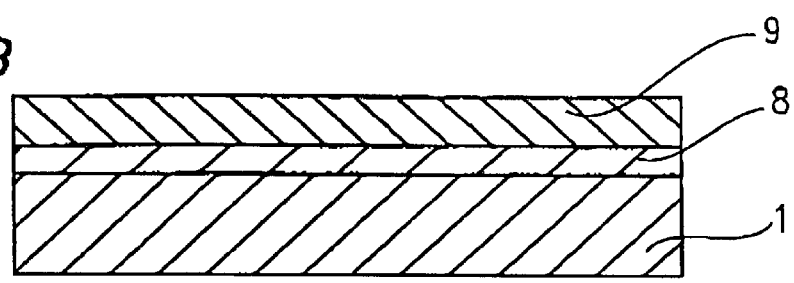
Figure 7C:
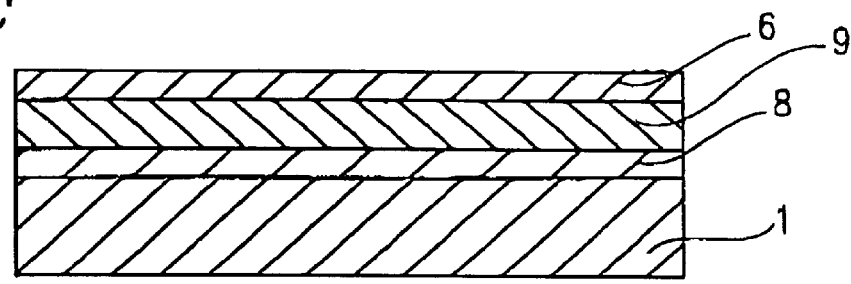
Figure 7D:
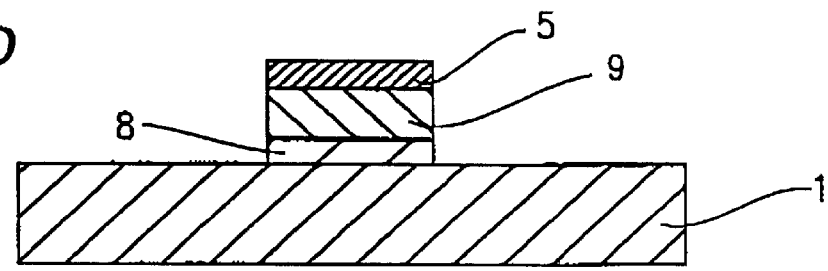
Figure 7E:
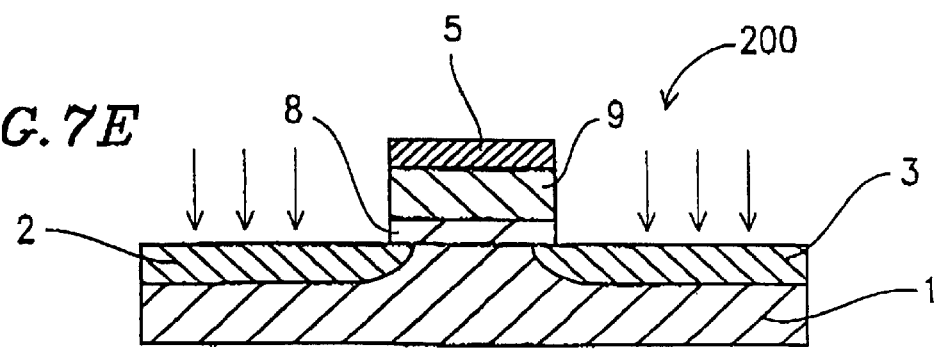
Figure 7F:
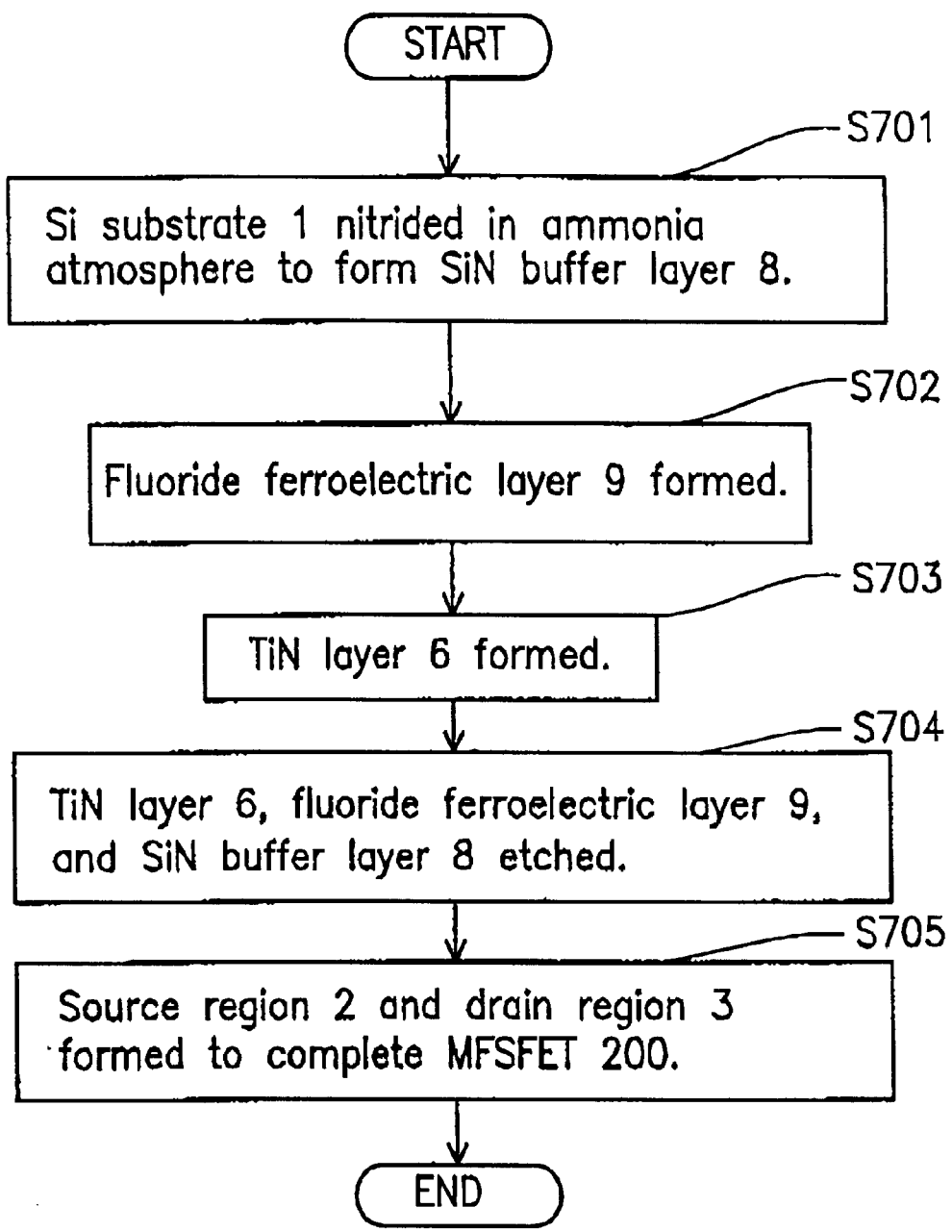
FIG. 7F is a flowchart illustrating the exemplary method shown in FIGS. 7A through 7E.

Next, as shown in FIG. 7B, the fluoride ferroelectric layer 9 formed of $BdMgF_4$ having a thickness of, for example, about 200 nm is formed by EB vacuum vapor deposition (step S702 of FIG. 7F). The fluoride ferroelectric layer 9 is formed under the conditions that the temperature of the p-type Si substrate 1 is about 600° C. and $BaF_2$ and $MgF_2$ are used as vapor deposition sources. The vapor deposition rates of $BaF_2$ and $MgF_2$ are set so that the molar ratio of $BaF_2$:$MgF_2$ is 1:1.

As shown in FIG. 7C, a TiN film 6 to be formed into the gate electrode 5 is formed by reactive sputtering using an $Ar/N_2$ mixed gas (step S703 of FIG. 7F).

As shown in FIG. 7D, the TiN film 6 and the fluoride ferroelectric layer 9 formed of $BaMgF_4$ are treated by etching to remove prescribed areas thereof, using a resist layer. The etching is performed with, for example, an $Ar/Cl_2$ mixed gas. The TiN film 6 becomes the gate electrode 5 as a result of etching. The buffer layer 8 formed of SiN is also etched using a resist layer and a $CF_4$ gas or the like (step S704 of FIG. 7F).

As shown in FIG. 7E, As (arsenic) as an n-type impurity is implanted, and then the resultant body is annealed. As a result, the source region 2 and the drain region 3 are formed. Thus, the MFSFET device 200 is completed (step S705 of FIG. 7F).

The fluoride ferroelectric layer 9 formed of BaMgF$_4$ has a specific dielectric constant of about 10 and a spontaneous polarization value of 2.0 $\mu$C/cm$^2$. The spontaneous polarization value is larger than that of the nitride ferroelectric layer 4 described in the first example.

SiN used for forming the buffer layer 8 has a higher barrier characteristic than SiO$_2$ against the diffusion of fluorine which is contained in the BMgF$_4$ used for forming the fluoride ferroelectric layer 9 in a large amount. Accordingly, SiN prevents the following phenomena deteriorating the MFSFET device 200 and thus improves the reliability of the MFSPET deice 200. (1) SiN prevents the interface level from increasing by the diffusion of fluorine during heat treatment processes of, for example, formation of the BaMgF$_4$ layer, and ion implantation and annealing for activation of the p-type Si substrate 1. (2) When SiO$_2$ is used, SiN prevents the thickness of the SiO$_2$ layer from increasing by the diffusion of oxygen which is released from the Si—O bond.

The operating characterstics of the MFSFET device 200 produced above will be described.

Figure 8:
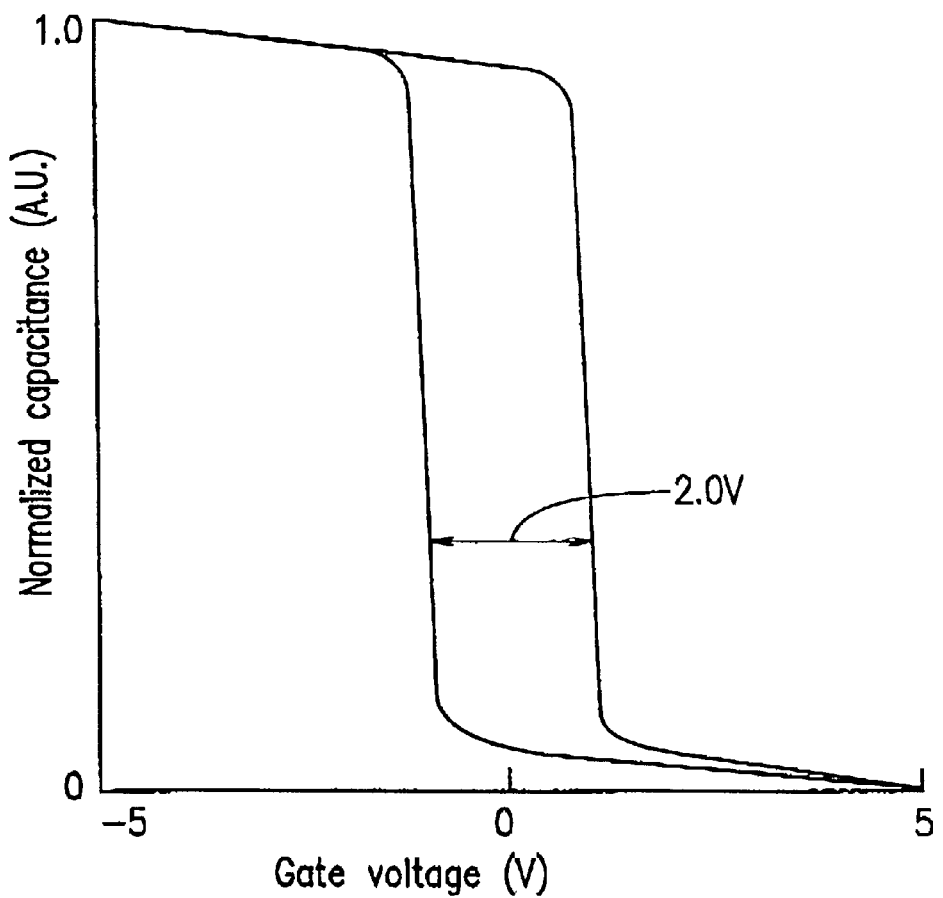
FIG. 8 is a graph illustrating a C-V characteristic of the semi conductor memory device shown in FIG. 6.

FIG. 8 is a graph illustrating a C-V characteristic of the MFSFET device 200. The C-V characteristic is measured under the conditions of ±5.0 V, 1 MHz and the gate area of 100 $\mu$m$^2$. As shown in FIG. 8, a memory window of about 2.0 V is obtained. The operating voltage is suppressed from increasing even when the buffer layer 8 formed of Si having a low specific dielectric constant (e.g., about 7) is included since the specific dielectric constant of the fluoride ferroelectric layer 9 formed of BaMgF$_4$ is relatively low (e.g., about 10).

EXAMPLE 3

Figure 9A:
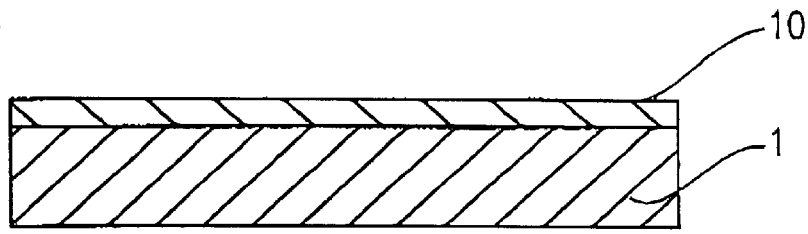
FIGS. 9A through 9E are cross-sectional views illustrating an exemplary method for producing a semiconductor memory device in a third example according to the present invention.

An MFSFET device 300 in a third example according to the present invention will be described. FIG. 9A through 9E are cross-sectional views illustrating an exemplary method for producing the MFSFET device 300, and FIG. 9F is a flowchart illustrating the exemplary method. Identical elements as those described with reference to FIG. 1 bear identical reference numerals and will not described in detail.

The MFSFET device 300 includes a buffer layer 10 formed of an SiO$_2$ film having a nitrided surface in place of the buffer layer 8 formed of SiN.

The p-type Si substrate 1 is treated with a BHF solution to remove a natural oxide layer (not Shown) on a surface of the p-type Si substrate 1. As shown in FIG. 9A, the resultant p-type Si substrate 1 is introduced into an RTA apparatus (not shown) to perform direct oxidation (RTO: rapid thermal oxidation) of the p-type Si substrate 1 using an oxygen gas. Thus, an SiO$_2$ film having a thickness of, for example, about 10 nm is formed (step S901 of FIG. 9F). A surface of the SiO$_2$ film is nitrided using an N$_2$ gas or an ammonia gas, thereby forming the buffer layer 10 (step S902 of FIG. 9F). Alternatively, the SiO$_2$ film can be formed by thermal oxidation. The surface of the SiO$_2$ film can alternatively be nitrided by heat treatment using ammonia gas plasma or N$_2$ gas plasma, resulting in similar effects.

Figure 9B:
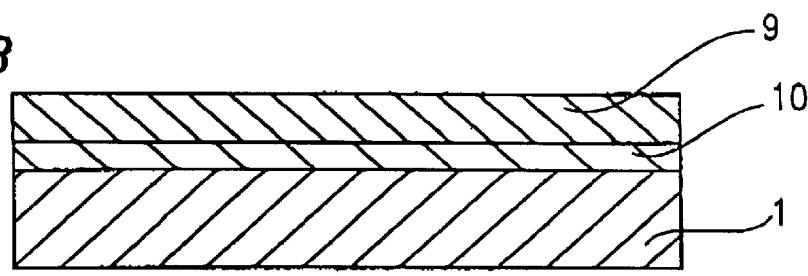
Figure 9C:
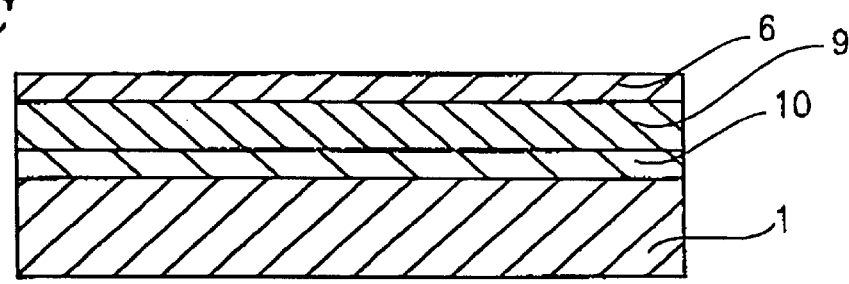
Figure 9D:
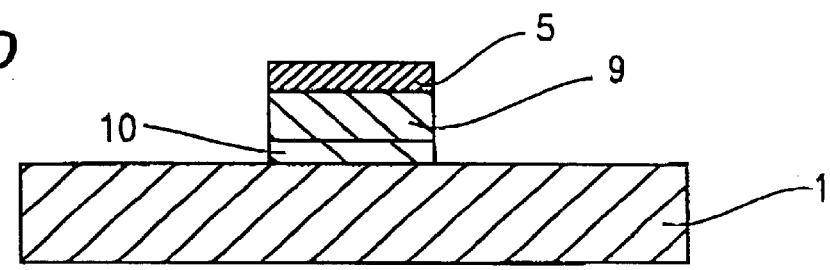
Figure 9E:
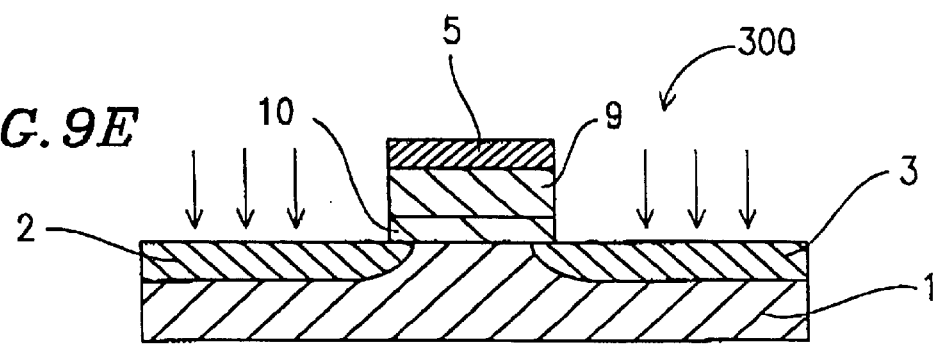
Figure 9F:
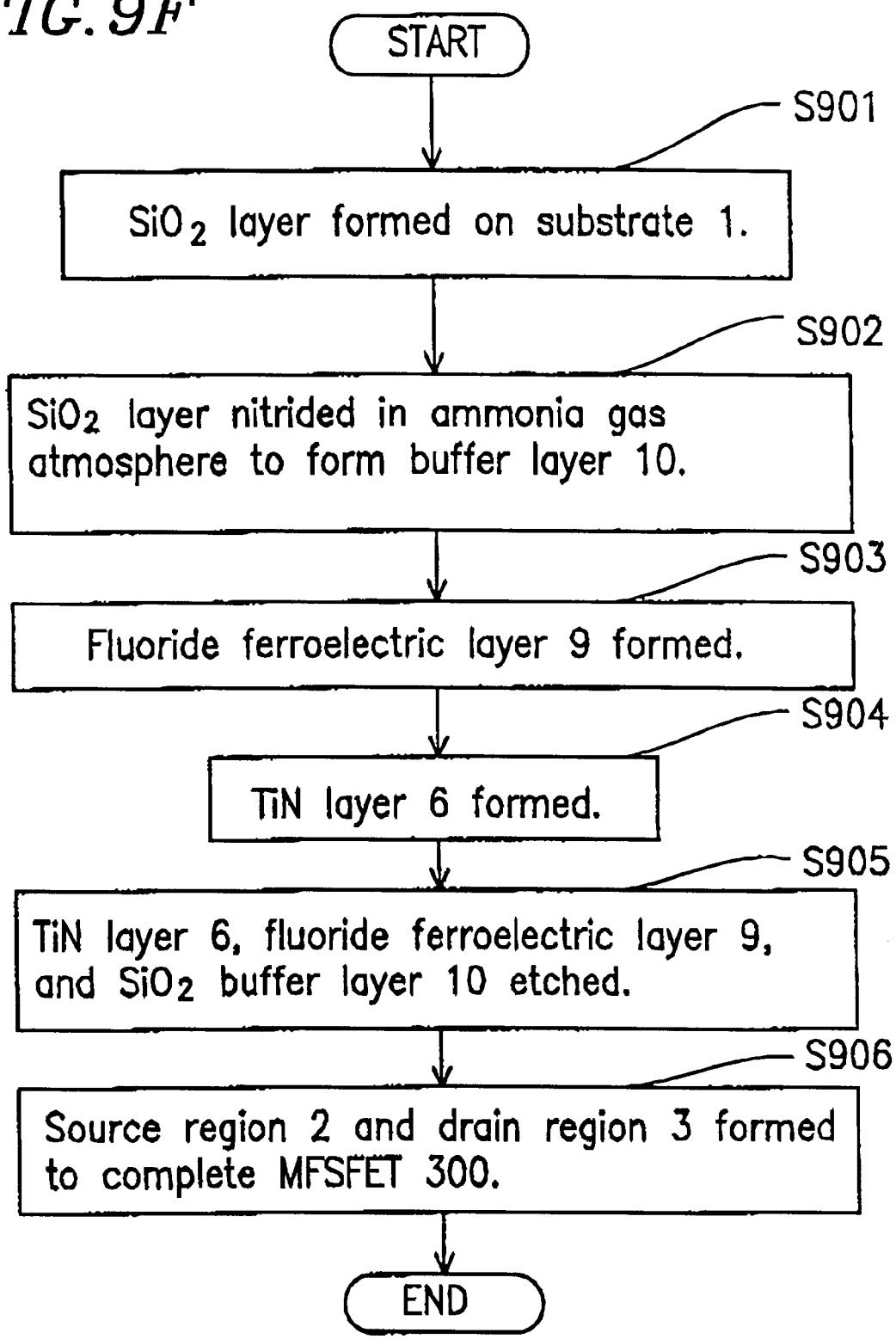
FIG. 9F is a flowchart illustrating the exemplary method shown in FIGS. 9A through 9E.

As in the second example, a fluoride ferroelectric layer 9 formed of BagF$_4$ having a thickness of, for example, about 200 nm is formed by EB vacuum vapor deposition as shown in FIG. 9B (step S903 of FIG. 9F). As shown in FIG. 9C, a TiN film 6 to be formed into the gate electrode 5 is formed by reactive sputtering using an Ar/N$_2$ mixed gas (step S904 of FIG. 9F). As shown in FIG. 9D, the TiN film 6 and the fluoride ferroelectric layer 9 formed of BaMgF$_4$ are treated by etching to remove prescribed areas thereof, using a resist layer. The etching is performed with, for example, an Ar/Cl$_2$ mixed gas. The TiN film 6 becomes the gate electrode 5 as a result of etching. The buffer layer 10 formed of SiO$_2$ is also etched using a resist layer and a CF$_4$ gas or the like (step S905 of FIG. 9F). As shown in FIG. 9E, As (arsenic) as an n-type impurity is implanted, and then the resultant body is annealed. As a result, the source region 2 and the drain region 3 are formed. Thus, the MFSFET device 300 is completed (step S906 of FIG. 9F).

The SiO$_2$ film having a nitrided surface has a higher barrier characteristic than SiO$_2$ which is not nitrided against the diffusion of fluorine which is contained in the BaMgF$_4$ used for forming the fluoride ferroelectric layer 9 in a large amount. Accordingly, the buffer layer 10 improves the reliability of the MFSFET device 300 like the buffer layer 8 in the second example.

EXAMPLE 4

Figure 10A:
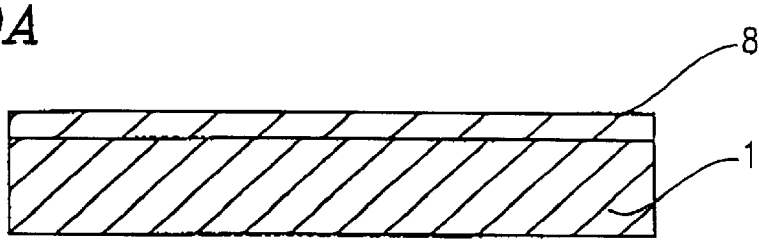
FIGS. 10A through 10F are cross-sectional views illustrating an exemplary method for producing a semiconductor memory device in a fourth example according to the present invention.
Figure 10B:
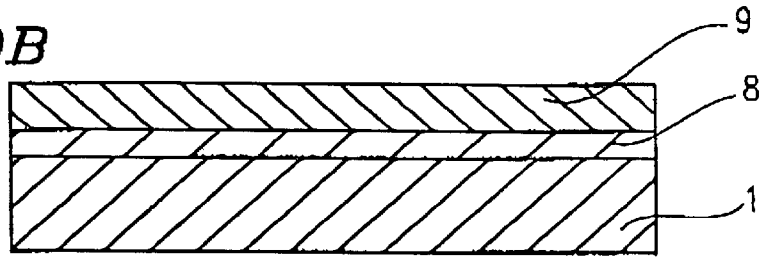
Figure 10C:
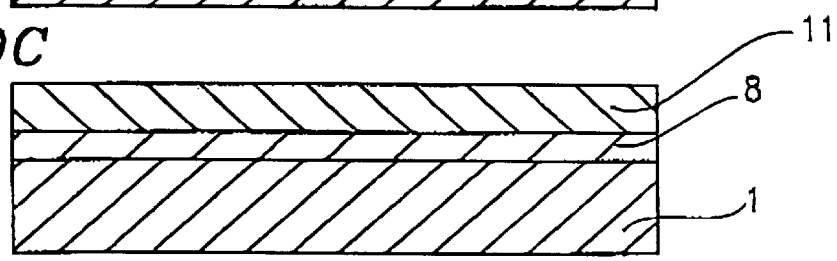
Figure 10D:
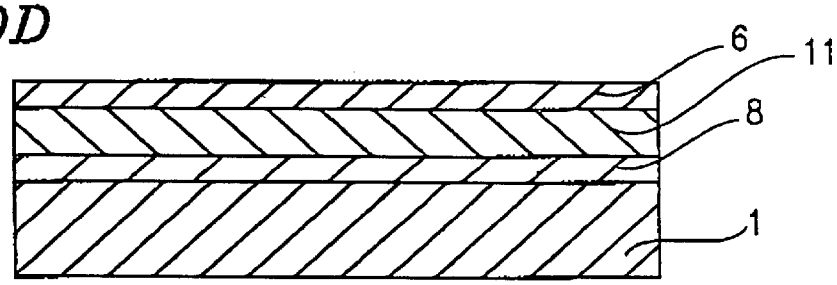
Figure 10E:
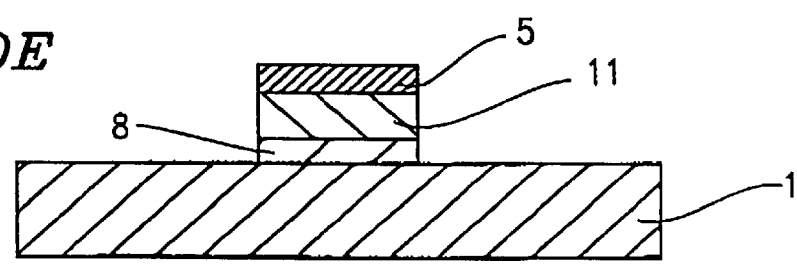

An MFSFET 400 in a fourth example according to the present invention will be described. FIGS. 10A through 10F are cross-sectional views illustrating an exemplary method for producing the MFSFET device 400, and FIG. 10G is a flowchart illustrating the exemplary, method. Identical element as those described with reference to FIG. 1 bear identical reference numerals and will not described in detail.

Figure 10F:
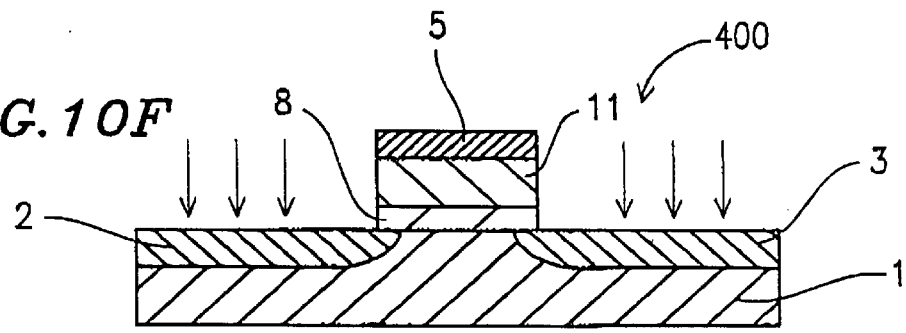
Figure 10G:
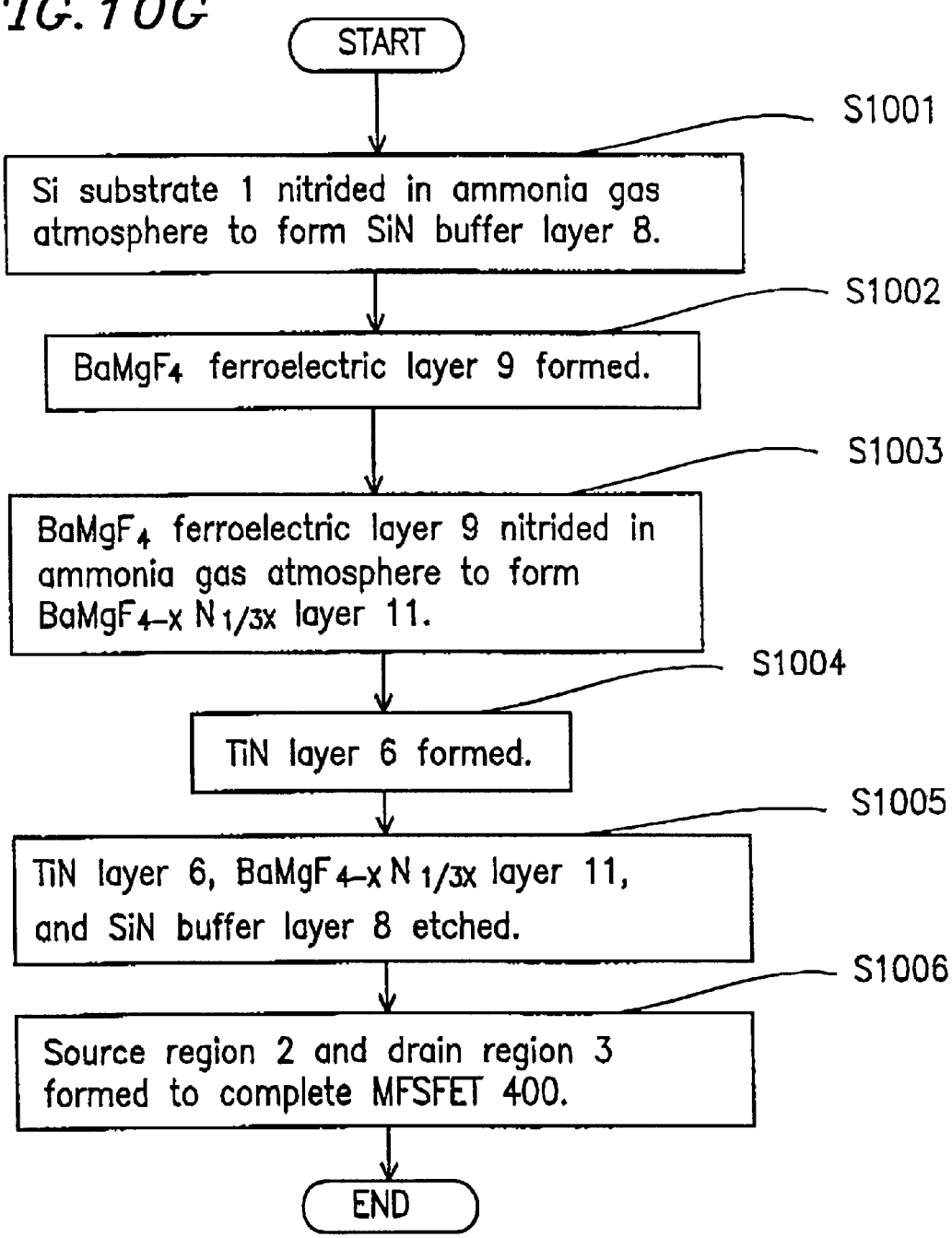
FIG. 10G is a flowchart illustrating the exemplary method shown in FIGS. 10A through 10F.

As shown in FIG. 10F, the MFSFET device 400 includes a p-type Si Substrate 1 having a source region 2 and a drain region 3 both of which are n$^+$-type impurity regions and are at prescribed locations of a surface area of the p-type Si substrate 1, a buffer layer 8 formed of a super-thin SiN film provided on a prescribed area of the Si substrate 1 between the source region 2 and the drain region 3, a ferroelectric layer 11 formed of BaMgF$_{4-x}$N$_{1/3x}$ provided on the buffer layer 8, and a gate electrode 5 provided on the ferroelectric layer 11.

The exemplary method for producing the MFSFET device 400 will be described.

The p-type Si substrate 1 is treated with a BHF solution to remove a natural oxide layer (not shown) on a surface of the p-type Si substrate 1. As shown in FIG. 10A, the resultant p-type Si substrate 1 is introduced into an RTA apparatus (not shown) to perform direct nitriding (RTN) of the p-type Si substrate 1 using an ammonia gas. Thus, the buffer layer 8 formed of an SiN film having a thickness of, for example, about 10 nm is formed (step S1001 of FIG 10G). Alternatively, the nitride layer (i.e., the buffer layer 8) can be formed by CVD.

Next, as shown in FIG. 10B, a fluoride ferroelectric layer 9 formed of BaMgF$_4$ having a thickness of, for example, about 200 nm is formed by EB vacuum vapor deposition (step S1002 of FIG. 10G). The fluoride ferroelectric layer 9 is formed under the conditions that the temperature of the p-type Si substrate 1 is about 600° C. and BaF$_2$ and MgF$_2$ are used as vapor deposition sources. The vapor deposition rates of BdF$_2$ and MgF$_2$ are set so that the molar ratio of BaF$_2$:MgF$_2$ is 1:1.

The fluoride ferroelectric layer 9 is heat-treated in an electric oven at about 450° C. for about 30 minutes in an ammonia gas atmosphere, thereby partially nitriding BaMgF$_4$. As a result, the fluoride ferroelectric layer 9 becomes the ferroelectric layer 11 formed of BaMgF$_{4-x}$N$_{1/3x}$ ($0 \leq x \leq 4$) partially including nitrogen (N), as shown in FIG. 10C (step S1003 of FIG. 10G). The nitriding can alternatively be performed by heat treatment using ammonia gas plasma or $N_2$ gas plasma, resulting in similar effects.

As shown in FIG. 10D, a TiN film 6 to be formed into the gate electrode 5 is formed by reactive sputtering using an $Ar/N_2$ mixed gas (step S1004 of FIG. 10G).

As shown in FIG. 10E, the TiN film 6 and the ferroelectric layer 11 formed of $BaMgF_{4-x}N_{1/3x}$ ($0 \leq x \leq 4$) are treated by etching to remove prescribed areas thereof, using a resist layer. The etching is performed with, for example, an $Ar/Cl_2$ mixed gas. The TiN film 6 becomes the gate electrode 5 as a result of etching. The buffer layer 8 formed of SiN is also etched using a resist layer and a $CF_4$ gas or the like (step S1005 of FIG. 10G).

As shown in FIG. 10F As (arsenic) as an n-type impurity is implanted, and then the resultant body is annealed. As a result, the source region 2 and the drain region 3 are formed. Thus, the MFSFET device 400 is completed (step S1006 of FIG. 10G).

The ferroelectric layer 11 formed of $BaMgF_{4-x}N_{1/3x}$ ($0 \leq x \leq 4$) has a specific dielectric constant of about 11, which is larger than that of the $BaMgF_4$ layer 9. Although the spontaneous polarization value of the ferroelectric layer 11 is 1.5 $\mu C/cm_2$, which is smaller than that of the $BaMgF_4$ layer 9, the MFSFET device 400 is sufficiently operable. The ferroelectric layer 11 obtained by the nitriding suppresses the chemical reactivity of water and other substances, thus improving the stability of the MFSFET device 400.

In the second through fourth examples, the MFSFET device is described. The present invention is also applicable to an MFMIS FET devices including a floating gate electrode and an insulating layer below the ferroelectric layer.

In the second through fourth examples, a $BaMgF_4$ is used as the fluoride ferroelectric material. Alternatively. $BaCoF_4$, $BaNiF_4$, and $BaZnF_4$ are usable, resulting in similar effects.

Other usable fluoride ferroelectric materials include, for example, materials represented by formula $(A_xB_{1-x}(C_yD_{1-y})F_5$ (where X is in the range of $0 \leq x \leq 1$, y is in the range of $0 \leq x \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn) such as, for example, $SrAlF_5$ and $SrTaF_5$; materials represented by formula $(A_xB_{1-x})(C_yD_{1-y})F_6$ (where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Ti, Ta, Mn, Co, Zr, Hf, V and Nb), is such as, for example, $BaMnF_6$ and $SrNbF_6$; and materials represented by formula $(A_xB_{1-x})_5(C_yD_{1-y})_3F_{19}$ (where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn), such as, for example, $Sr_5Ti_3F_{19}$ and $Ba_5V_3F_{19}$.

In the second through fourth examples, the fluoride ferroelectric layer is formed by EB vacuum vapor deposition. Alternatively, MOCVD, MBE, laser ablation, sputtering and the like are usable, resulting in similar effects.

EXAMPLE 5

Figure 11:
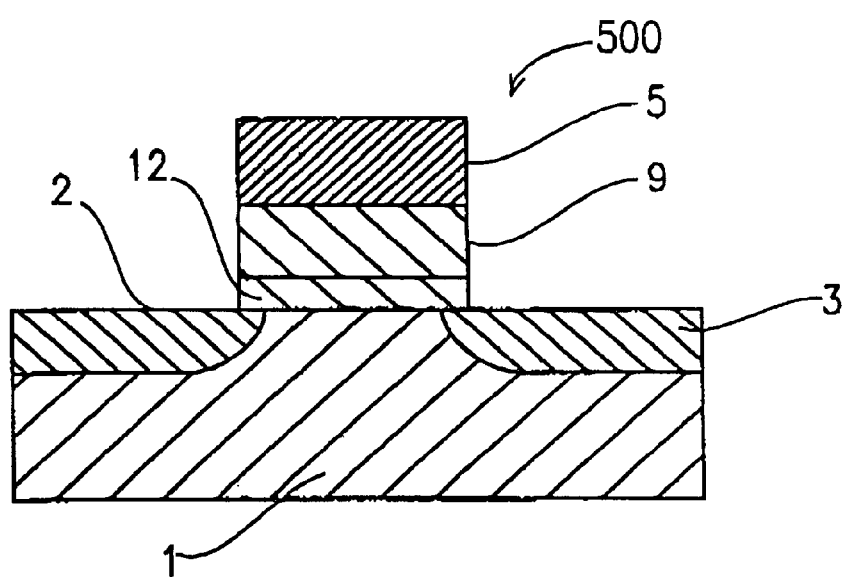
FIG. 11 is a cross-sectional view of a semiconductor memory device in a fifth example according to the present invention.

FIG. 11 is a cross-sectional view of a MFSFET device 500 in a fifth example according to the present invention. Identical elements as those described with reference to FIG. 1 bear identical reference numerals and will not described in detail.

As shown in FIG. 11, the MFSFET device 500 includes a p-type Si substrate 1 having a source region 2 and a drain region 3 both of which are $n^+$-type impurity regions and are at prescribed locations of a surface area of the p-type Si substrate 1, a buffer layer 12 formed of $MgSiO_3$ provided on a prescribed area of the Si substrate 1 between the source region 2 and the drain region 3, a fluoride ferroelectric layer 9 formed of $BaMgF_4$ provided on the buffer layer 12, and a gate electrode 5 provided on the ferroelectric layer 9.

An exemplary method for producing the MFSFET device 500 will be described. FIGS. 12A through 12E are cross-sectional views illustrating an exemplary method for producing the MFSFET device 500, and FIG. 12F is a flowchart illustrating the exemplary method.

Figure 12A:
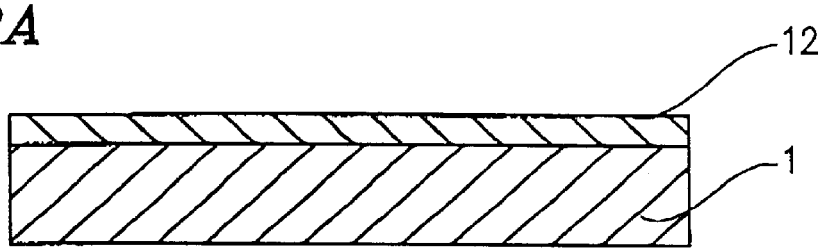
FIGS. 12A through 12E are cross-sectional views illustrating an exemplary method for producing the semiconductor memory device shown in FIG. 11.

The p-type Si substrate 1 is treated with a BHF solution to remove a natural oxide layer (not shown) on a Surface of the p-type Si substrate 1. As shown in FIG. 12A, the buffer layer 12 formed of $MgSio_3$ having a thickness of, for example, about 10 nm is formed on the p-type Si substrate 1 (step S1201 of FIG. 12F) by EB vacuum vapor deposition. The buffer layer 12 is formed under the conditions that the temperature of the p-type Si substrate 1 is about 600° C. and MgO and $SiO_2$ are used as vapor deposition sources. The vapor deposition rates of MgO and $SiO_2$ are set so that the molar ratio of $MgO:SiO_2$ is 1:1. The buffer layer 12 is heat-treated in an electric oven at about 450° C. for about 30 minutes in an oxygen gas or in an ozone-containing oxygen gas, thereby improving the interface characteristic of the buffer layer 12.

Figure 12B:
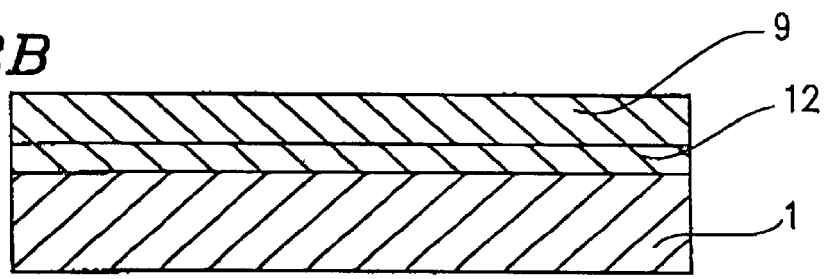
Figure 12C:
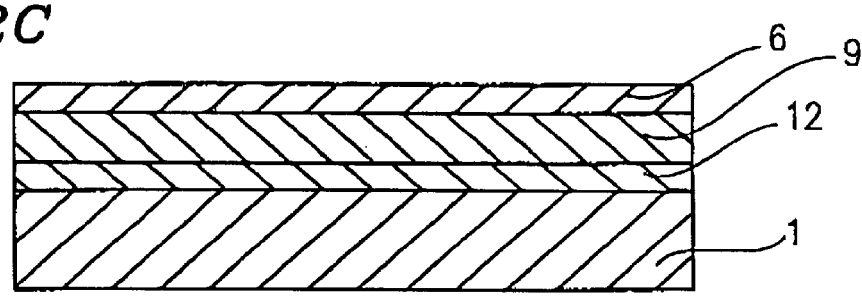
Figure 12D:
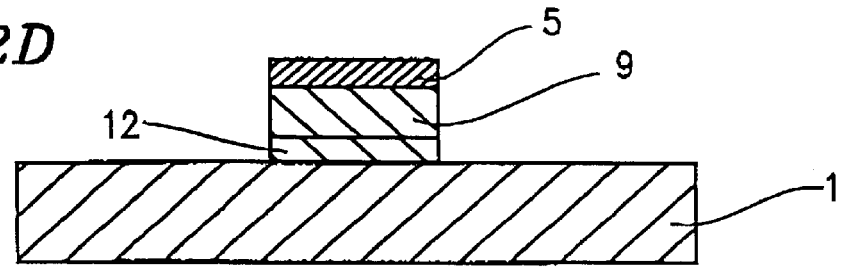
Figure 12E:
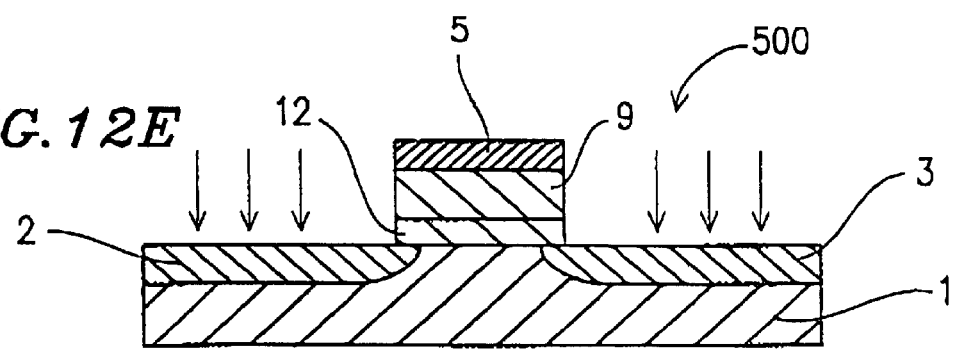
Figure 12F:
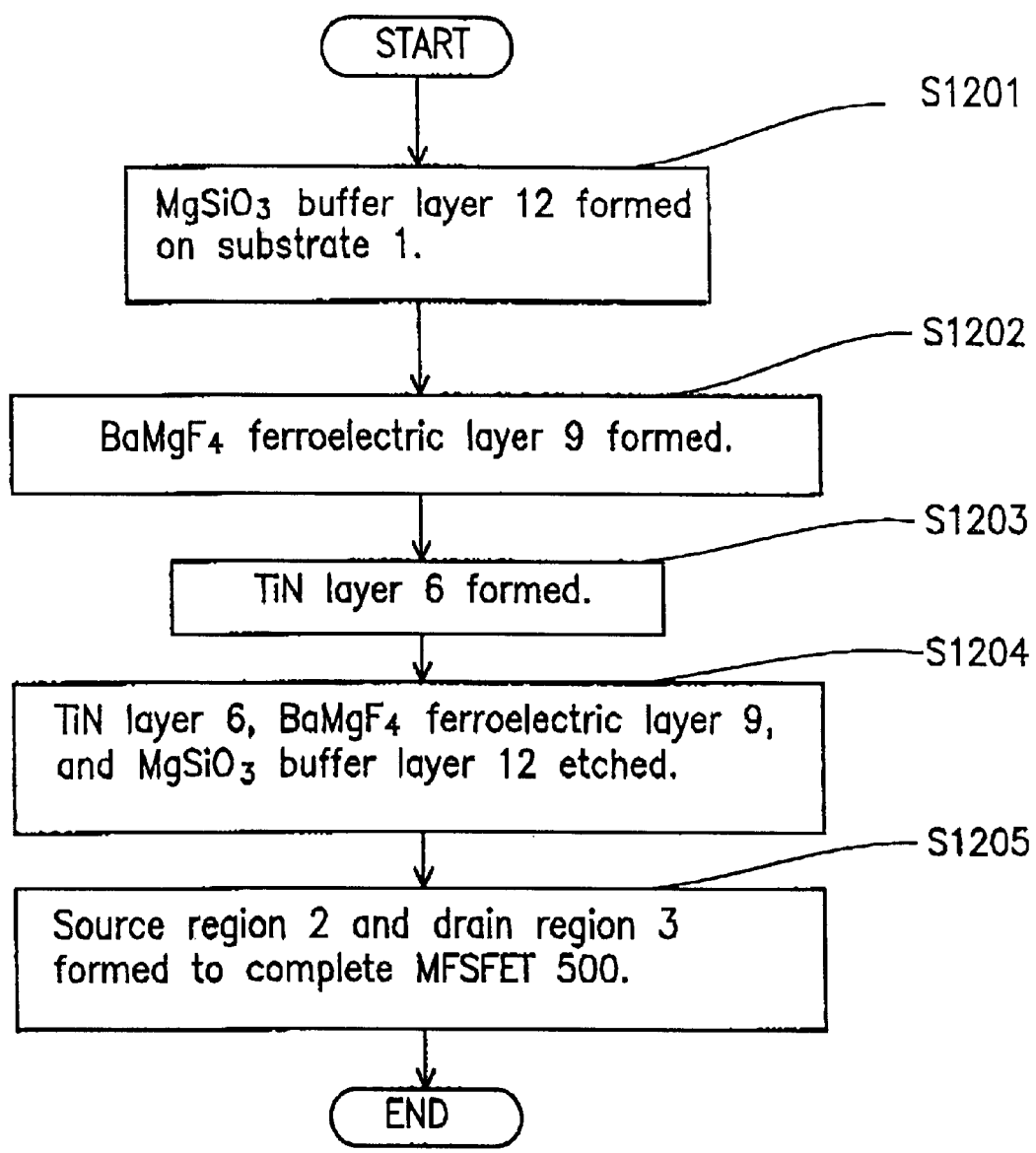
FIG. 12F is a flowchart illustrating the exemplary method shown in FIGS. 12A through 12E.

As shown in FIG. 12B, the fluoride ferroelectric layer 9 formed of $BaMgF_4$ having a thickness of, for example, about 200 nm is formed by EB vacuum vapor deposition (step S1202 of FIG. 12F). The fluoride ferroelectric layer 9 is formed under the conditions that the temperature of the p-type Si substrate 1 is about 600° C. and $BaF_2$ and $MgF_2$ are used as vapor deposition sources. The vapor deposition rates of $BaF_2$ and $MgF_2$ are set so that the molar ratio of $BaF_2:MgF_2$ is 1:1.

As shown in FIG. 12C, a TiN film 6 to be formed into the gate electrode 5 is formed by reactive sputtering using an $Ar/N_2$ mixed gas (step S1203 of FIG. 12F).

As shown in FIG. 12D, the TiN film 6 and the ferroelectric layer 9 formed of $BaMgF_4$ are treated by etching to remove prescribed areas thereof, using a resist layer. The etching is performed with, for example, an $Ar/Cl_2$ mixed gas. The TiN film 6 becomes the gate electrode 5 as a result of etching. The buffer layer 12 formed of $MgSiO_3$ is also etched using a resist layer and an $Ar/Cl_2/CF_4$ mixed gas or the like (step S1204 of FIG. 12F).

As shown in FIG. 12E, As (arsenic) as an n-type impurity is implanted, and then the resultant body is annealed. As a result, the source region 2 and the drain region 3 are formed. Thus, the MPSFET device 500 is completed (step S1205 of FIG. 12F).

$MgSiO_3$ used for the buffer layer 12 contains $SiO_2$ and Mg, which is an element of $BaMgF_4$ used for forming the fluoride ferroelectric layer 9 on the buffer layer 12 and thus has a satisfactory characteristic at the interface with the p-type Si substrate 1. $MgSiO_3$ further has a very low reactivity with $BaMgF_4$ and improves the crystallinity of $BagF_4$. The spontaneous polarization value of the fluoride ferroelectric layer 9 formed of BaMgFis 2.6 $\mu C/cm^2$, which is larger than that of the formed of fluoride ferroelectric layer 9 in the second example, which is also formed of $BaMgF_4$.

In the fifth example, the buffer layer is formed of $MgSiO_3$ Alternatively, the buffer layer can be formed of $Mg_2SiO_4$, SrSiO$_3$, Sr$_2$SiO$_4$, (Mg$_x$Sr$_{1-x}$)SiO$_3$ or (Mg$_x$Sr$_{1-x}$)$_2$SiO$_4$ (0≦x≦1), resulting in similar effects. Mg$_2$SiO$_4$ can be obtained by providing MgO and SiO$_2$ with the molar ratio of MgO:SiO$_2$ being 2:1. SrSiO$_3$ and Sr$_2$SiO$_4$ can be obtained by using SrO and SiO$_2$ as the vapor deposition sources. (Mg$_x$Sr$_{1-x}$)SiO$_3$ and (Mg$_x$Sr$_{1-x}$)$_2$SiO$_4$ (0≦x≦1) can be obtained by using MgO, SrO and SiO$_2$ as the vapor deposition sources.

It is preferable that the ferroelectric layer 9 and the buffer layer 12 both contain Sr and Mg; i.e., it is preferable that the ferroelectric layer 9 is formed of (Ba$_x$Sr$_{1-x}$)MgF$_4$ or Ba(Mg$_x$Sr$_{1-x}$)F$_4$ (0≦x≦1) and the buffer layer 12 is formed of (Mg$_x$Sr$_{1-x}$)SiO$_3$ or (Mg$_x$Sr$_{1-x}$)$_2$SiD$_4$ (0≦x≦1).

EXAMPLE 6

Figure 13A:
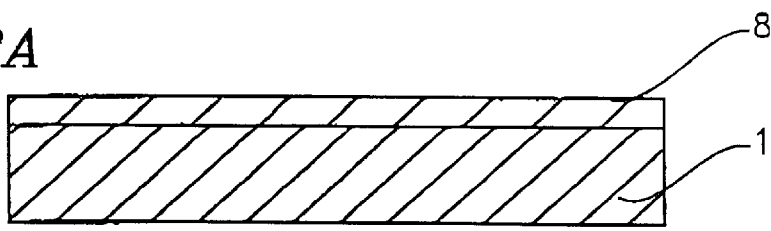
FIGS. 13A through 13F are across-sectional views illustrating an exemplary method for producing a semiconductor memory device in a sixth example according to the present invention.
Figure 13B:
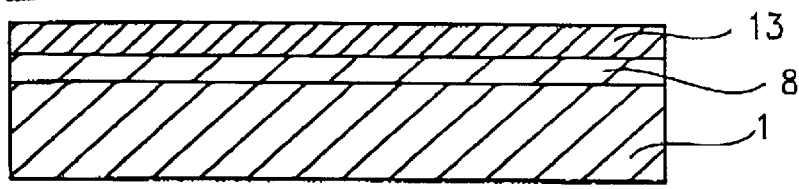
Figure 13C:
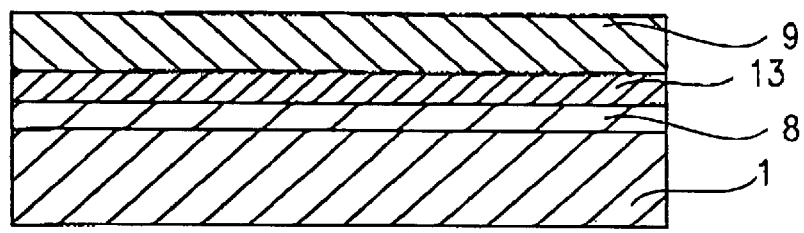
Figure 13D:
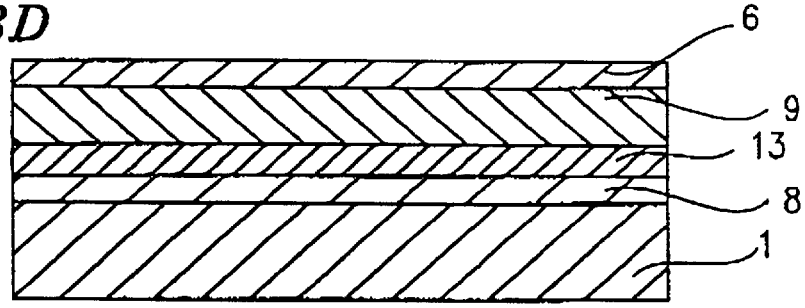
Figure 13E:
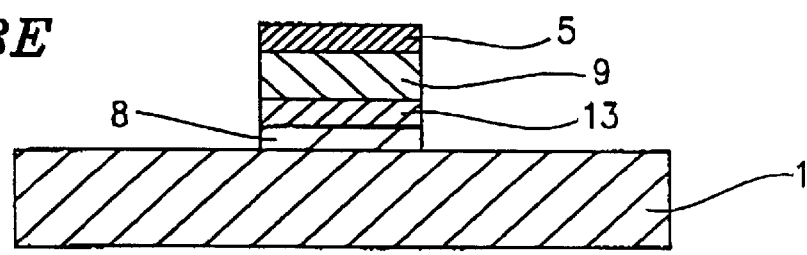

An MFSFET device 600 in a sixth example according to the present invention will be described. FIG. 13A through 13F are cross-sectional views illustrating an exemplary method for producing the MFSFET device 600, and FIG. 13G is a flowchart illustrating the exemplary method. Identical elements as those described with reference to FIG. 1 bear identical reference numerals and will not described in detail.

Figure 13F:
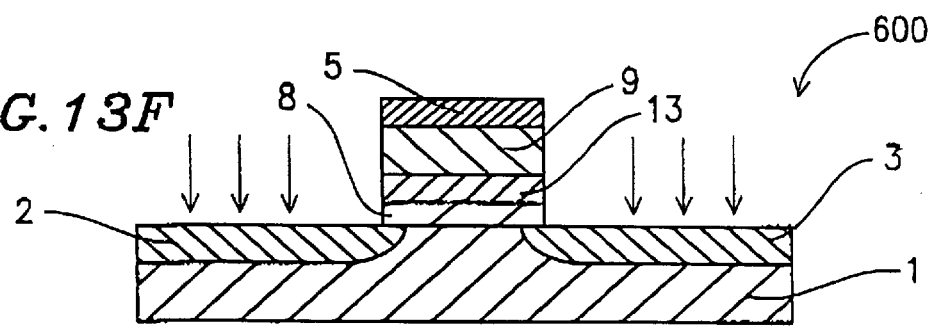
Figure 13G:
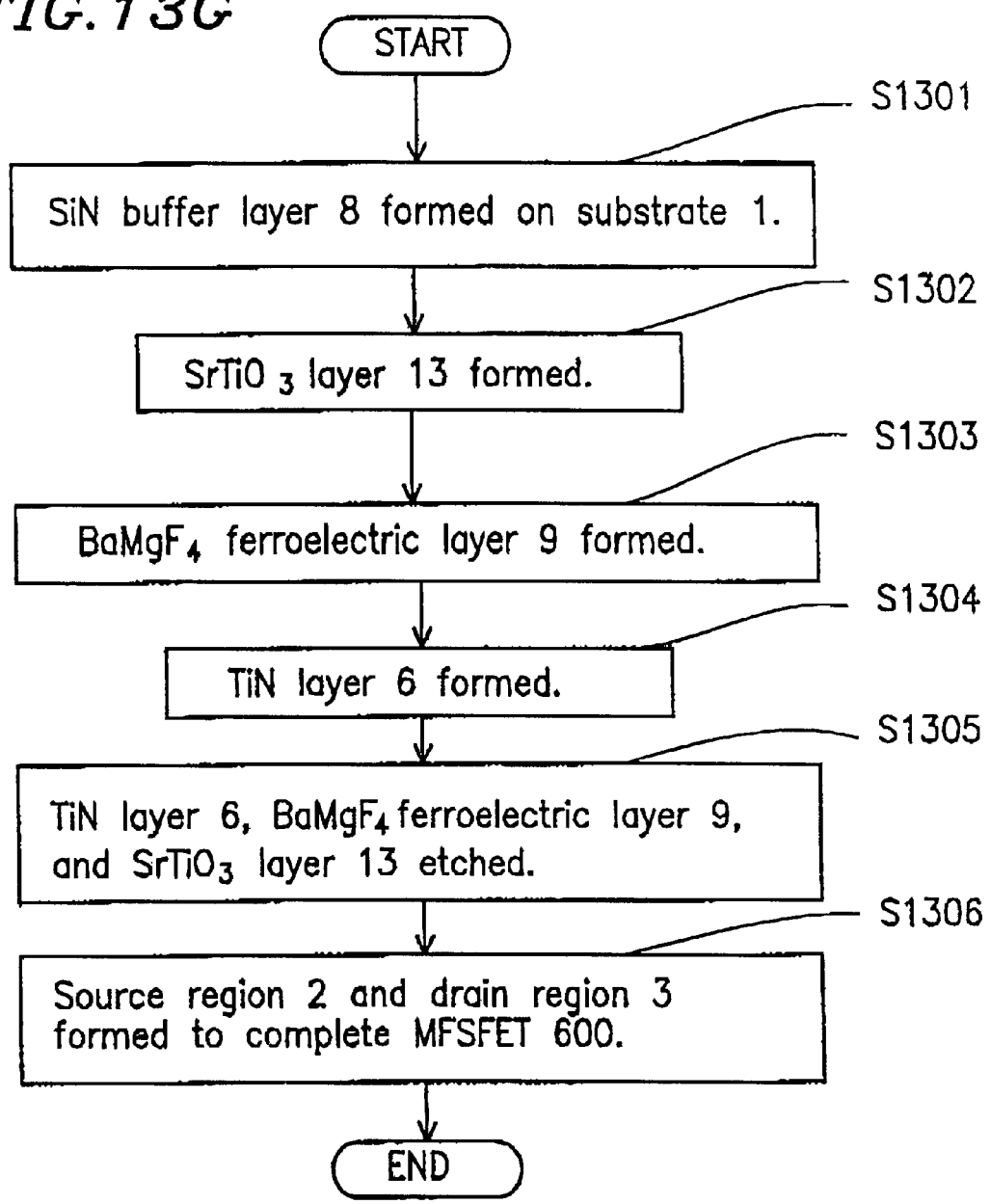
FIG. 13G is a flowchart illustrating the exemplary method shown in FIGS. 13A through 13F.

As shown in FIG. 13F, the MFSFET device 600 includes a p-type Si substrate 1 having a source region 2 and a drain region 3 both of which are n$_+$-type impurity regions and are at prescribed locations of a surface area of the p-type Si substrate 1, a buffer layer 8 formed of SiN provided on a prescribed area of the Si substrate 1 between the source region 2 and the drain region 3, an SrTiO$_3$ layer 13 provided on the buffer layer 8, a fluoride ferroelectric layer 9 formed of BaMgF$_4$ provided on the SrTiO$_3$ layer 13, and a gate electrode 5 provided on the ferroelectric layer 9.

The exemplary method for producing the MFSFET device 600 will be described.

The p-type Si substrate 1 is treated with a BHF solution to remove a natural oxide layer (not shown) on a surface of the p-type Si substrate 1. As shown in FIG. 13A, the resultant p-type Si substrate 1 is introduced into an RTA apparatus (not shown) to perform direct nitriding (RTN) of the p-type Si substrate 1 using an ammonia gas. Thus, the buffer layer 8 formed of an SiN film having a thickness of, for example, about 5 nm is formed (step. S1301 of FIG. 13G). Alternatively, the nitride layer (i.e., the buffer layer 8) can be formed by CVD.

As shown in FIG. 13B, the SrTiO$_3$ layer 13 having a thickness of, for example, about 30 nm is formed on the buffer layer 6 by reactive RF sputtering (step S1302 of FIG. 13G). The SrTiO$_3$ layer 13 is formed under the conditions that the temperature of the p-type Si substrate 1 is about 350° C., the RF power is about 300 W, an SrTiO$_3$ target is used, and an Ar/O$_2$ mixed gas is used.

As shown in FIG. 13C, the fluoride ferroelectric layer 9 formed of BaMgF$_4$ having a thickness of, for example, about 300 nm is formed by EB vacuum vapor deposition (step S1303 of FIG. 13G). The fluoride ferroelectric layer 9 is formed under the conditions that the temperature of the p-type Si substrate 1 is about 600° C. and BaF$_2$ and MgF$_2$ are used as vapor deposition sources. The vapor deposition rates of BaF$_2$ and MgF$_2$ are set so that the molar ratio of BaF$_2$:MgF$_2$ is 1:1.

As shown in FIG. 13D, a TiN film 6 to be formed into the gate electrode 5 is formed by reactive sputtering using an Ar/N$_2$ mixed gas (step S1304 of FIG. 13G).

As shown in FIG. 13E, the TiN film 6, the ferroelectric layer 9 formed of BaMgF$_4$ and the SrTiO$_3$ layer 13 are treated by etching to remove prescribed areas thereof using a resist layer. The etching is performed with, for example, an Ar/Cl$_2$ mixed gas (step S1305 of FIG. 13G), As shown in FIG. 13F, As (arsenic) as an n-type impurity is implanted, and then the resultant body is annealed. As a result, the source region 2 and the drain region 3 are formed. Thus, the MFSFET device 600 is completed (step S1306 of FIG. 13G).

The MFSFET device 600 including the buffer layer a formed of SiN solves the following problem occurring in the Si/SiO$_2$/SrTiO$_3$ structure. The SrTiO$_3$ target usually contains a high concentration of fluorine. The fluorine is diffused into the SiO$_2$ layer while the SrTiO$_3$ layer is formed by sputtering or during heat treatment processes, thereby cutting the Si—O bond. As a result, the Si—F bond is formed, thus increasing the interface level. Oxygen released from the Si—O bond is diffused into the Si/SiO$_2$ interface to form a new SiO$_2$ film. Accordingly, the thickness of the SiO$_2$ film is increased. This increases the operating voltage, By using SiN for the buffer layer 8, the diffusion of fluorine is prevented, and thus the deterioration of the device characteristics to prevented.

In the sixth example, the buffer layer 8 is formed of SiN. Alternatively, the buffer layer 8 can be formed of an SiO$_2$ film having a surface nitrided by heat treatment, resulting in a similar effect of preventing the diffusion of fluorine. The heat treatment is performed in an RTA apparatus using, for example, ammonia gas, N$_2$O gas or nitrogen radical ion-containing gas.

In the sixth example, the fluoride ferroelectric layer 9 is formed of BaMgF$_4$. Alternatively, the ferroelectric layer can be formed of other fluoride ferroelectric materials or oxide ferroelectric materials such as, for example, PZT, SrBi$_2$Ta$_2$O$_9$, and Bi$_4$Ti$_3$O$_{12}$.

In the sixth example, the MFSFET device is described. The present invention is also applicable to an MFMIS FET devices including a floating gate electrode and an insulating layer below the ferroelectric layer.

EXAMPLE 7

Figure 14A:
FIGS. 14A through 14G are cross-sectional views illustrating an exemplary method for producing a semiconductor memory device in a seventh example according to the present invention.

An MFSFET device 700 in a seventh example according to the present invention will be described. FIG. 14A through 14G are cross-sectional views illustrating an exemplary method for producing the MFSFET device 700, and FIG. 14H is a flowchart illustrating the exemplary method. Identical elements as those described with reference to FIG. 1 bear identical reference numerals and will not described in detail.

Figure 14B:
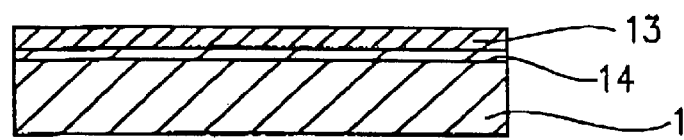
Figure 14C:
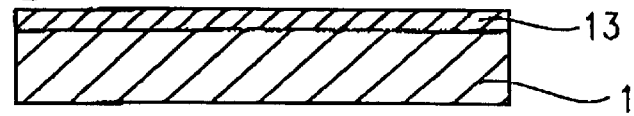
Figure 14D:
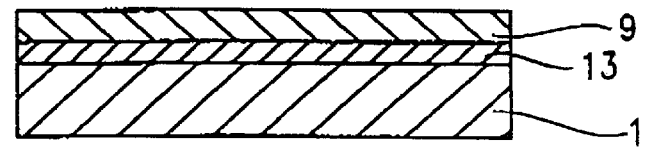
Figure 14E:
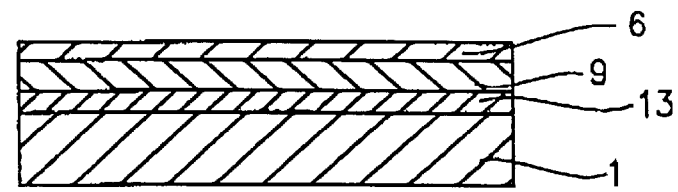
Figure 14F:
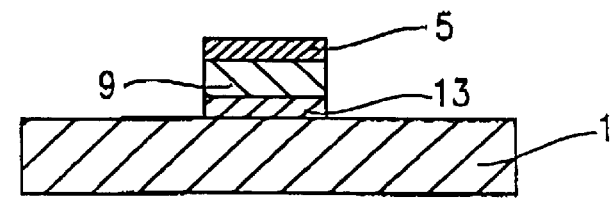
Figure 14G:
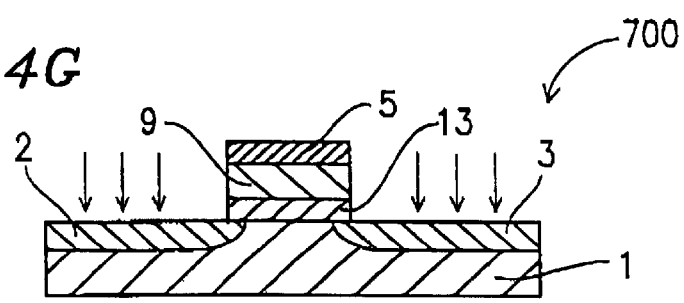

As shown in FIG. 14G, the MFSFET device 700 includes a p-type Si substrate 1 having a source region 2 and a drain region 3 both of which are n$_+$-type impurity regions and are at prescribed locations of a surface area of the p-type Si substrate 1, an SrTiO$_3$ layer 13 provided on a prescribed area of the Si substrate 1 between the source region 2 and the drain region 3. a fluoride ferroelectric layer 9 formed of BaMgF$_4$ provided on the SrTiO$_3$ layer 13, and a gate electrode 5 provided on the ferroelectric layer 9.

The exemplary method for producing the MFSFET device 700 will be described.

The p-type Si substrate 1 is treated with a BHF solution to remove a natural oxide layer (not shown) on a surface of the p-type Si substrate 1. As shown in FIG. 14A, the resultant p-type Si substrate 1 is promptly introduced into an EB vacuum vapor deposition apparatus (not shown) to form a super thin TiSr layer 14 having a thickness of, for example, about 4 nm (step S1401 of FIG. 14H). The TiSr layer 14 is formed at room temperature, using Sr and Ti as vapor deposition sources. The vapor deposition rates of Sr and Ti are set so that the molar ratio of Sr:Tr is 1:1.

As shown in FIG. 14B, the $SrTiO_3$ layer 13 having a thickness of, for example, about 30 nm is formed on the TiSr layer 14 by reactive RF Sputtering using an $SrTiO_3$ target (step S1402 of FIG. 14H). The $SrTiO_3$ layer 13 is formed by a two-step method; i.e., an Ar gas is used to form the first 10 nm, and then an $Ar/O_2$ mixed gas is used to form the remaining 20 nm. The temperature of the p-type Si substrate 1 is preferably about 200° C. to about 300° C., more preferably about 200° C. to about 250° C., so that Ti and Sr deposited on the p-type Si substrate 1 do not react with Si. The RF power is about 100 W to about 250 W.

While the $SrTiO_3$ layer 13 is formed by sputtering, the TiSr layer 14 is oxidized and incorporated into the $SrTiO_3$ layer 13 as shown in FIG. 14C. It is preferable that the incorporation of the TiSr layer 14 into the $SrTiO_3$ layer 13 is substantially perfected, after the $SrTiO_3$ layer 13 is formed, by heat-treating the resultant body in an electric oven at about 200° C. to about 250° C. for about 30 minutes in an oxygen gas or an ozone-containing oxygen gas. This process is preferable to maintain the interface between the resultant $SrTiO_3$ layer 13 (after the TiSr layer 14 is incorporated) and the p-type Si substrate 1 stable in the heat treatment performed for forming the ferroelectric layer As shown in FIG. 14D, the fluoride ferroelectric layer 9 formed of $BaMgF_4$ having a thickness of, for example, about 300 nm is formed by EB vacuum vapor deposition (step S1403 of FIG. 14H) on the $SrTiO_3$ layer 13. The fluoride ferroelectric layer 9 is formed under the conditions that the temperature of the p-type Si substrate 1 is about 600° C. and $BaF_2$ and $MgF_2$ are used as vapor deposition sources. The vapor deposition rates of $BaF_2$ and $MgF_2$ are set so that the molar ratio of $BaF_2:MgF_2$ is 1:1.

AS shown in FIG. 14E, a TiN film 6 to be formed. into the gate electrode 5 is formed by reactive sputtering using an $Ar/N_2$ mixed gas (step S1404 of FIG. 14H).

As shown in FIG. 14F, the TiN film 6, the ferroelectric layer 9 formed of $BaMgF_4$ and the $SrTiO_3$ layer 13 are treated by etching to remove prescribed areas thereof, using a resist layer. The etching to performed with, for example, an $Ar/Cl_2$ mixed gas (step S1405 of FIG. 14H).

As shown in FIG. 14G, As (arsenic) as an n-type impurity is implanted, and then the resultant body is annealed. As a result, the source region 2 and the drain region 3 are formed. Thus, the MFSFET device 700 is completed (step S1406 of FIG. 14H).

The dielectric constant of the diode, including the p-type Si substrate 1 and the $SrTiO_3$ layer 13, obtained based on the capacitance value of the diode is about 150. The value of 150 is larger than the dielectric constant obtained when the $SrTiO_3$ 13 is formed directly an the p-type Si substrate 1 without using the TiSr layer 14 (about 35). This indicates that the an $SiO_2$ film having a low specific dielectric constant to suppressed from being formed on the $Si/SrTiO_3$ interface.

In the seventh example, the $SrTiO_3$ layer 13 is formed by RF sputtering. Alternatively, the $SrTiO_3$ layer 13 can be formed by laser ablation which can form the layer at a temperature of about 300° C. or less or vacuum vapor deposition, resulting in similar effects.

In the seventh example, the ferroelectric layer 9 is formed of $BaMgF_4$. Alternatively, the ferroelectric layer can be formed of other fluoride ferroelectric materials or oxide ferroelectric materials such as, for example, PZT, $SrBi_2Ta_2O_9$, and $Bi_4Ti_3O_{12}$.

In the seventh examples the MSFET device is described. The present invention is also applicable to an MFMIS FET devices including a floating gate electrode and an insulating layer below the ferroelectric layer.

In the first through seventh examples, the gate electrode 5 the formed of TiN. Alternatively, the gate electrode can be formed of Pt or other appropriate materials.

In the first through seventh examples, the MFSFET device includes the p- type Si substrate 1. An n-tope Si substrate can also be used.

According to the present invention, a stable and reliable semiconductor memory device which has satisfactory characteristics at the interface between the semiconductor substrate and the gate insulating layer formed of a nitride or fluoride ferroelectric material and can be produced using a general Si-MOSFET process: and as method for producing the same are provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
    a semiconductor substrate having a channel therein;
    a gate insulating layer formed of a ferroelectric material provided on the semiconductor substrate; and
    a gate electrode provided on the gate insulating layer,
        wherein the ferroelectric material includes a nitrogen (N) and at least one element selected from the group consisting of Mg, Br, Ba and Ca.

2. A semiconductor memory device according to claim 1, wherein the ferroelectric material is represented by formula (1):

$$A_2BN_3 \qquad (1)$$

where A is one element selected from the group consisting of Mg, Sr, Ba and Ca, and B is one element selected from the group consisting of V, Nb, Ta and Mn.

3. A semiconductor memory device according to claim 1, wherein the ferroelectric materials represented by formula (2):

$$(A_xB_{1-x})_2CN_3 \qquad (2)$$

where x is in the range of $0 \leq x \leq 1$, A and B are each one element selected from the group consisting of Mg, Sr, Ba and Ca, and C is one element selected from the group consisting of V, Nb, Ta and Mn.

4. A semiconductor memory device according to claim 1, wherein the ferroelectric material is represented by formula (3):

$$(A_xB_{1-x})_2(C_yD_{1-y})N_3 \qquad (3)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of V, Nb, Ta and Mn.

5. A semiconductor memory device according to claim 1, wherein the ferroelectric material is represented by formula (4):

$$AB_2N_4 \qquad (4)$$

where A is one element selected from the group consisting of Mg, Sr, Ba and Ca, and B is one element selected from the group consisting of V, Nb, Ta and Mn.

6. A semiconductor memory device according to claim 1, wherein the ferroelectric material is represented by formula (5):

$$(A_xB_{1-x})C_2N_4 \qquad (5)$$

where x is in the range of $0 \leq x \leq 1$, A and B are each one element selected from the group consisting of Mg, Sr, Ba and Ca, and C is one element selected from the group consisting of V, Nb, Ta and Mn.

7. A semiconductor memory device according to claim 1, wherein the ferroelectric material is represented by formula (6):

$$(A_xB_{1-x})(C_yD_{1-y})_2N_4 \qquad (6)$$

where X is in the range of $0 \leq x \leq 1$, y is in the range of $0 \leq y \leq 1$, A and B are each one element selected from the group consisting of Mg, Sr, Ba and Ca, and C and D are each one element selected from the group consisting of V, Nb, Ta and Mn.

8. A semiconductor memory device according to claim 1, wherein the ferroelectric material is represented by formula (7):

$$A_2BN_2 \qquad (7)$$

where A and B are each one element selected from the group consisting of Mg, Sr, Ba and Ca.

9. A semiconductor memory device according to claim 1, wherein the ferroelectric material is represented by formula (8):

$$(A_xB_{1-x})_2(C_yD_{1-y})N_2 \qquad (8)$$

where x is in the range of $0 \leq x \leq 1$, y is in the range of $0 \leq y \leq 1$, A, B, C and D are each one element selected from the group consisting of Mg, Sr, Ba and Ca.

10. A semiconductor memory device according to claim 1, wherein the ferroelectric material is represented by formula (9):

$$A_3B_2N_4 \qquad (9)$$

Where A is one element selected from the group consisting of Mg, Sr, Ba and Ca, and B is one element selected from the group consisting of Al, Y, La, Sc, Co, Gd, Ce, Nd, Er, V, Ti, Ta, Nb and Mn.

11. A semiconductor memory device according to claim 1, wherein the ferroelectric material is represented by formula (10):

$$A_xB_{1-x})_3C_2N_4 \qquad (10)$$

where x is in the range of $0 \leq x \leq 1$, A and B are each one element selected from the group consisting of Mg, Sr, Ba and Ca, and C is one element selected from the group consisting of Al, Y, La, Sc, Co, Gd, Ce, Nd, Er, V, Ti, Ta, Nb and Mn.

12. A semiconductor memory device according to claim 1, wherein the ferroelectric material is represented by formula (11):

$$(A_xB_{1-x})_3(C_yD_{1-y2}N_4 \qquad (11)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn.

13. A semiconductor memory device according to claim 1, wherein the ferroelectric material is represented by formula (12):

$$A_3B_5N_7 \qquad (12)$$

where A is one element selected from the group consisting of Mg, Sr, Ba and Ca, and B is one element selected from the group consisting of Al, Y, La, Sc, Co, Gd, Ce, Nd, Er, V, Ti, Ta, Nb and Mn.

14. A semiconductor memory device according to claim 1, wherein the ferroelectric material is represented by formula (13):

$$(A_xB_{1-x})_3C_5N_7 \qquad (13)$$

where x is in the range of $0 \leq x \leq 1$, A and B are each one element selected from the group consisting of Mg, Sr, Be and Ca, and C is one element selected from the group consisting of Al, Y, La, Sc, Co, Gd, Ce, Nd, Er, V, Ti, Ta, Nb and Mn.

15. A semiconductor memory device according to claim 1, wherein the ferroelectric material is represented by formula (14):

$$(A_xB_{1-x})_3(C_yD_{1-y})_5N_7 \qquad (14)$$

where x 1s in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn.

16. A semiconductor memory device according to claim 1, wherein the ferroelectric material is represented by formula (15):

$$A_2B_3C_2N_7 \qquad (15)$$

where A it one element selected from the group consisting of Mg, Sr, Ba and Ca, B is one element selected from the group consisting of Al, Y, La, Sc, Co, Gd, Ce, Nd, Er, V, Ti, Ta, Nb and Mn, and C is one element selected from the group consisting of Ti, Ta, Mn, Co, Zr, Hf, V and Nb.

17. A semiconductor memory device according to claim 1, wherein the ferroelectric material is represented by formula (16):

$$(A_xB_{1-x})_2C_3D_2N_7 \qquad (16)$$

where x is in the range of $0 \leq x \leq 1$, A and B are each one element selected from the group consisting of Mg, Sr, Ba and Ca, C is one element selected from the group consisting of Al, Y, La, Sc, Co, Gd, Ce, Nd, Er, V, Ti, Ta, Nb and Mn, and D is one element selected from the group consisting of Ti, Ta, Mn, Co, Zr, Hf, V and Nb.

18. A semiconductor memory device according to claim 1, wherein the ferroelectric material is represented by formula (17):

$$(A_xB_{1-x})_2(C_yD_{1-y})_3(E_xF_{1-z})_2N_7 \qquad (17)$$

where x is in the range of $0 \leq x \leq 1$, y is in the range of $0 \leq y \leq 1$, z is in the range of $0 \leq z \leq 1$, A and B are each one element selected from the group consisting of Mg, Sr, Ba and Ca, C and D are each one element selected from the group consisting of Al, Y, La, Sc, Co, Gd, Ce, Nd, Er, V, Ti, Ta, Nb and Mn, and E and F are each one element selected from the group consisting of Ti, Ta, Mn, Co, Zr, Hf, V and Nb.

19. A semiconductor memory device according to claim 1, further comprising a buffer layer between the semiconductor substrate and the gate insulating layer, wherein the buffer layer is formed of one of Si and $SiO_2$.

20. A semiconductor memory device, comprising:
a semiconductor substrate having a channel therein;
a gate insulating layer provided on the semiconductor substrate;
a gate electrode provided on the gate insulating layer;
a buffer layer formed of SiN provided between the semiconductor substrate and the gate insulating layer, wherein the gate insulating layer is formed of a fluoride ferroelectric material.

21. A semiconductor memory device according to claim 20, wherein the fluoride ferroelectric material is one material selected from the group consisting of $BaMgF_4$, $BaCoF_4$, $BaNiF_4$ and $BaZnF_4$.

22. A method for producing a semiconductor memory device according to claim 20, wherein the fluoride ferroelectric material is one material selected from the group consisting of $BaMgF_4$, $BaCoF_4$, $BaNiF_4$ and $BaZnF_4$.

23. A semiconductor memory device according to claim 20, wherein the fluoride ferroelectric material in represented by formula (18):

$$ABF_5 \qquad (18)$$

where A is one element selected from the group consisting of Mg, Sr, Ba and Ca, and B is one element selected from the group consisting of Al, Y, La, Sc, Co, Gd, Ce, Nd, Er, V, Ti, Ta, Nb and Mn.

24. A semiconductor memory device according to claim 20, wherein the fluoride ferroelectric material is represented by formula (19):

$$(A_xB_{1-x})(C_yD_{1-y})F_5 \qquad (19)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ce, Nd, Er, V, Ti, Ta, Nb and Mn.

25. A semiconductor memory device according to claim 20, wherein the fluoride ferroelectric material is represented by formula (20):

$$ABF_6 \qquad (20)$$

where A is one element selected from the group consisting of Mg, Sr, Ba and Ca, and B is one element selected from the group consisting of Ti, Ta, Mn, Co, Zr, Hf, V and Nb.

26. A semiconductor memory device according to claim 20, wherein the fluoride ferroelectric material is represented by formula (21):

$$(A_xB_{1-x})(C_yD_{1-y})F_6 \qquad (21)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Ti, Ta, Mn, Co, Zr, Hf, V and Nb.

27. A semiconductor memory device according to claim 20, wherein the fluoride ferroelectric material is represented by formula (22):

$$A_5B_3F_{19} \qquad (22)$$

where A is one element selected from the group consisting of Mg, Sr, Ba and Ca, and B is one element selected from the group consisting of Al, Y, La, Sc, Co, Gd, Ce, Nd, Er, V, Ti, Ta, Nb and Mn.

28. A semiconductor memory device according to claim 20, wherein the fluoride ferroelectric material is represented by formula (23):

$$(A_xB_{1-x})_5(C_yD_{1-y})_3F_{19} \qquad (23)$$

where x is in the range of $0 \leq x \leq 1$, y is in the range of $0 \leq y \leq 1$, A and B are each one element selected from the group consisting of Mg, Sr, Ba and Ca, and C and D are each one element selected from the group consisting of Al, Y, La, Sc, Co, Gd, Ca, Nd, Er, V, Ti, Ta, Nb, and Mn.

29. A semiconductor memory device, comprising:
a semiconductor substrate having a channel therein;
a buffer layer formed of at least one of $MgSiO_3$, $Mg_2SiO_4$, $SrSiO_3$, $Sr_2SiO_4$, $(Mg_xSr_{1-x})SiO_3$ and $(Mg_xSr_{1-x})_2SiO_4$ (where $0 \leq x \leq 1$) provided on the semiconductor substrate;
a gate insulating layer formed of a ferroelectric material provided on the buffer layer; and
a gate electrode provided on the gate insulating layer.

30. A semiconductor memory device according to claim 29, wherein the ferroelectric material includes at least one element selected from the group consisting of Mg and Sr.

31. A semiconductor memory device according to claim 29, wherein the ferroelectric material is formed of at least one material selected from the group consisting of $(Ba_xSr_{1-x})MgF_4$ and $Ba(Mg_xSr_{1-x})F_4$, where $0 \leq x \leq 1$.

* * * * *